United States Patent
Murphy et al.

(10) Patent No.: US 11,747,733 B2
(45) Date of Patent: Sep. 5, 2023

(54) FREEZE-LESS METHODS FOR SELF-ALIGNED DOUBLE PATTERNING

(71) Applicant: Tokyo Electron Limited, Tokyo (JP)

(72) Inventors: Michael Murphy, Albany, NY (US); Charlotte Cutler, Hopkinton, MA (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/455,753

(22) Filed: Nov. 19, 2021

(65) Prior Publication Data

US 2022/0221797 A1 Jul. 14, 2022

Related U.S. Application Data

(60) Provisional application No. 63/135,217, filed on Jan. 8, 2021.

(51) Int. Cl.
*G03F 7/32* (2006.01)
*G03F 7/16* (2006.01)
*G03F 7/11* (2006.01)

(52) U.S. Cl.
CPC ............ *G03F 7/32* (2013.01); *G03F 7/11* (2013.01); *G03F 7/16* (2013.01)

(58) Field of Classification Search
CPC ..... G03F 7/32; G03F 7/11; G03F 7/16; G03F 7/0045; G03F 7/0392; G03F 7/0397;
(Continued)

(56) References Cited

U.S. PATENT DOCUMENTS

2005/0124774 A1* 6/2005 Allen ................. G03F 7/0046
526/310
2010/0047724 A1* 2/2010 Takeshita ............. G03F 7/0046
430/326
(Continued)

FOREIGN PATENT DOCUMENTS

CN 104570601 A * 4/2015 ........... C07C 309/12
KR 102310834 B1 10/2021

OTHER PUBLICATIONS

Sanjay Malik, Jeff Eisele, Allyn whewell, Lawrence Ferreira, Timothy Holt, and Murrae Bowden, "Post-exposure bake temperature considerations for high activation energy resist systems", J. Photopolym. Sci. Technol., vol. 13, No. 4, 2000 (Year: 2000).*

(Continued)

*Primary Examiner* — Mark F. Huff
*Assistant Examiner* — Alexander Nicholas Lee
(74) *Attorney, Agent, or Firm* — Slater Matsil, LLP

(57) ABSTRACT

A method of patterning a substrate includes depositing an overcoat in openings of a relief pattern. The relief pattern includes a solubility-shifting agent and a deprotectable monomer sensitive to the solubility-shifting agent. The overcoat includes another deprotectable monomer sensitive to the solubility-shifting agent. The overcoat has a solubility threshold relative to a predetermined developer that is lower than the solubility threshold of the relief pattern relative to the developer. The method includes activating the solubility-shifting agent to at least reach the solubility threshold of the overcoat without reaching the solubility threshold of the relief pattern, diffusing the solubility-shifting agent a predetermined distance from structures of the relief pattern into the overcoat to form soluble regions in the overcoat, and developing the substrate with the developer to remove the soluble regions of the overcoat. The soluble regions are (Continued)

soluble in the developer while the relief pattern remains insoluble in the developer.

20 Claims, 13 Drawing Sheets

(58) Field of Classification Search
CPC .......... G03F 7/091; G03F 7/095; G03F 7/322; G03F 7/40; G03F 7/405
See application file for complete search history.

(56) References Cited

U.S. PATENT DOCUMENTS

| | | | |
|---|---|---|---|
| 2010/0130016 A1* | 5/2010 | DeVilliers ........... | H01L 21/0273 438/703 |
| 2011/0147985 A1 | 6/2011 | Cheng et al. | |
| 2015/0212414 A1 | 7/2015 | Pohlers et al. | |
| 2015/0294878 A1* | 10/2015 | deVilliers ........... | H01L 21/0273 438/703 |
| 2015/0301449 A1* | 10/2015 | Ohashi ................. | C07C 309/12 430/296 |
| 2016/0181100 A1 | 6/2016 | deVilliers et al. | |
| 2016/0377982 A1* | 12/2016 | deVilliers ............... | G03F 7/405 430/325 |
| 2017/0329229 A1* | 11/2017 | Carcasi .................... | G03F 7/40 |

OTHER PUBLICATIONS

PCT International Search Report and Written Opinion, International Application No. PCT/US2021/061069, dated Nov. 30, 2021, 11 pages.

* cited by examiner

US 11,747,733 B2

FREEZE-LESS METHODS FOR SELF-ALIGNED DOUBLE PATTERNING

CROSS-REFERENCE TO RELATED APPLICATIONS

This application claims the benefit of U.S. Provisional Application 63/135,217, filed on Jan. 8, 2021, which application is hereby incorporated herein by reference in their entirety.

TECHNICAL FIELD

The present invention relates generally to microfabrication, and, in particular embodiments, to microfabrication of integrated circuits using self-aligned double patterning.

BACKGROUND

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic exposure system.

This exposure creates a latent pattern within the radiation-sensitive material which can then be developed. Developing refers to dissolving and removing a portion of the radiation-sensitive material to yield a relief pattern (topographic pattern). The portion of material removed can be either irradiated regions or non-irradiated regions of the radiation-sensitive material depending on a photoresist tone and/or type of developing solvent used. The relief pattern can then function as a mask layer defining a pattern.

Preparation and development of various films used for patterning can include thermal treatment (e.g. baking). For example, a newly applied film can receive a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrates typically include one or more baking modules. Some photolithography processes include coating a substrate with a thin film of bottom anti-reflective coating (BARC), followed by coating with a resist, and then exposing the substrate to a pattern of light as a process step for creating microchips. A relief pattern created can then be used as a mask or template for additional processing such as transferring the pattern into an underlying layer.

The minimum resolution attainable with a single lithographic exposure is limited, amongst other things, by the wavelength of light used (the so-called diffraction limit). Techniques such as immersion lithography can be utilized to lower the diffraction limit. Multiple patterning processes such as Self-Aligned Double Patterning (SADP) are increasingly being used for scaling semiconductor features below photolithographic limits. Multiple patterning processes can double pitch (for each additional patterning) and thus help to achieve feature sizes that are otherwise unattainable.

However, multiple patterning processes are frequently costly and complex. Additionally, multiple patterning process flows can be incompatible with high volume manufacturing. Further, many multiple patterning techniques require additional process steps such as etching, deposition, development, and treatments which also increase complexity and reduce throughput. Therefore multiple pattern processes that reduce cost, reduce complexity, and/or increase compatibility are desirable.

SUMMARY

In accordance with an embodiment of the invention, a method of patterning a substrate includes depositing an overcoat in openings of a relief pattern supported by a substrate. The relief pattern includes a solubility-shifting agent and a first deprotectable monomer sensitive to the solubility-shifting agent. The overcoat includes a second deprotectable monomer sensitive to the solubility-shifting agent. The relief pattern has a first solubility threshold relative to a predetermined developer while the overcoat has a second solubility threshold relative to the predetermined developer that is lower than the first solubility threshold. The method also includes activating the solubility-shifting agent to at least reach the second solubility threshold of the overcoat without reaching the first solubility threshold of the relief pattern, diffusing the solubility-shifting agent a predetermined distance from structures of the relief pattern into the overcoat to form soluble regions in the overcoat, and developing the substrate with the predetermined developer to remove the soluble regions of the overcoat. The soluble regions are soluble in the predetermined developer while the relief pattern remains insoluble in the predetermined developer.

In accordance with another embodiment of the invention, a method of patterning a substrate includes depositing an overcoat in openings of a relief pattern supported by a substrate. The relief pattern includes a solubility-shifting agent and a first deprotectable monomer having a first activation energy. The overcoat includes a second deprotectable monomer having a second activation energy. The first activation energy is higher than the second activation energy. The method also includes deprotecting the second deprotectable monomer without deprotecting the first deprotectable monomer to form soluble regions in the overcoat by activating the solubility-shifting agent and diffusing the solubility-shifting agent a predetermined distance from structures of the relief pattern into the overcoat, and developing the substrate with the predetermined developer to remove the soluble regions of the overcoat. The soluble regions are soluble in a predetermined developer while the relief pattern remains insoluble in the predetermined developer.

In accordance with still another embodiment of the invention, a method of patterning a substrate includes forming a relief pattern on a substrate from a layer of photoresist by exposing the photoresist to actinic radiation including a first wavelength to activate a first photoacid generator. The photoresist includes the first photoacid generator and a solubility-shifting agent. The method also includes depositing a deprotectable resin in openings of the relief pattern, activating the solubility-shifting agent, diffusing the solubility-shifting agent a predetermined distance from structures of the relief pattern into the deprotectable resin to form soluble regions in the deprotectable resin by deprotecting the deprotectable resin, and developing the substrate with the predetermined developer to remove the soluble regions of the deprotectable resin. The soluble regions are soluble in a predetermined developer while the relief pattern remains insoluble in the predetermined developer.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
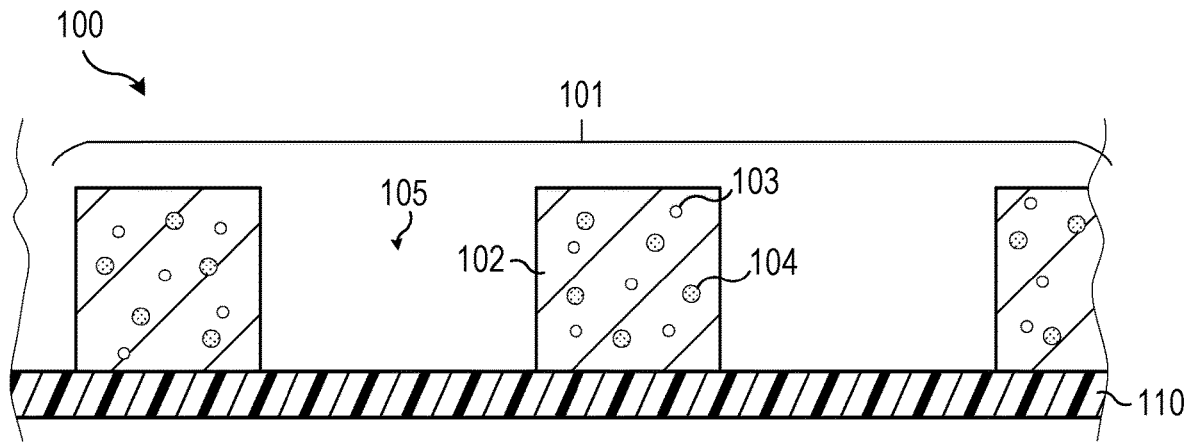
FIGS. 1A-1F illustrate a conventional antispacer process flow including a freeze step. The conventional antispacer process occurs through the dissolution of an acid-sensitive overcoat via acid diffusion from a photoresist mandrel.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The order of discussion of the different steps as described herein has been presented for the sake of clarity. In general, these steps can be performed in any suitable order. Additionally, although each of the features, techniques, configurations, etc. described herein may be discussed in different places of this disclosure, it is intended that each of the concepts can be executed independently of each other or in combination with each other. Accordingly, the present invention can be embodied and viewed in many different ways.

The ever continuous scaling of microelectronics requires improved patterning resolution. One approach is spacer technology to define a sub-resolution line feature via atomic layer deposition (ALD). A challenge of spacer techniques, however, is that if the opposite tone feature is desired, spacer techniques can be complex due to involving over-coating another material, chemical mechanical planarization (CMP), and reactive ion etch (RIE) to exhume the spacer material leaving a narrow trench, which can be costly.

Antispacer technology is a self-aligned technology that uses the diffusion length of a reactive species to define a critical dimension (CD), creating a narrow trench. To form a narrow slot (in contrast to, e.g., a narrow trench), the reactive species may be controlled spatially via exposure through a mask. Reactive species may be controlled uniformly across a wafer by decomposition of a thermal acid generator via a bake process. Antispacer techniques may enable access to narrow slot contact features at dimensions beyond the reach of advanced lithographic capabilities.

Some conventional antispacer process flows are complex and highly inefficient due to the addition of several process steps. For example, one conventional antispacer process includes an additional overcoat step of patterned structures, an additional bake to diffuse a reactive species into the patterned structures from the overcoat, and an additional overcoat removal step. Another overcoat step is then followed by a development step to form the antispacer structures.

Other conventional antispacer processes diffuse a reactive species from patterned structures into an overcoat, but require a "freeze" step (i.e. a treatment that neutralizes a solubility-shifting potential of a layer having an acid generator). The freeze step is necessary because the reactive species is included in the patterned structures and therefore undesirably solubilizes the patterned structures themselves when the future antispacer regions of the overcoat are solubilized. For example, the use of a thermal freeze process can inhibit a de-protected photoresist mandrel from solubilizing in an aqueous developer that is subsequently used to remove a de-protected (or de-crosslinked or otherwise changed in solubility) overcoat to reveal antispacer features.

Yet freeze processing is imperfect resulting in reduced uniformity and increased CD. Furthermore, the additional freeze step reduces throughput. The incorporation of thermal freeze functionality into a photoresist is a significant challenge due to the stringent requirements for high volume manufacturing and the reactive environment of the polymer resin. As a result, antispacer processes requiring fewer process steps that are compatible with high volume manufacturing flows are desired.

The techniques described herein include patterning a substrate without the need for a freeze step. That is, the described techniques are "freeze-less" methods of patterning a substrate capable of forming sub-resolution antispacer features. In various embodiments, a method of patterning a substrate includes forming an overcoat over a relief pattern on a substrate. The relief pattern includes a solubility-shifting agent that is activated and diffused into the overcoat to form soluble regions in the overcoat while maintaining insolubility of the relief pattern. The soluble regions of the overcoat are then subsequently removed by developing the substrate.

The solubility-shifting agent may advantageously enable formation of sub-resolution antispacer features without reaching the solubility threshold (e.g., a de-protection threshold) of the relief pattern relative to a predetermined developer (e.g. an aqueous developer). The solubility-shifting agent may be an acid generator. For example, the solubility-shifting agent may be a photoacid generator (PAG), a thermal acid generator (TAG), a photodestroyable quencher (PDQ), or other suitable solubility-shifting agent.

The techniques described herein may advantageously pair the innate dissolution contrast of a selected overcoat material and a selected relief pattern material (e.g. a photoresist) such that the solubility of the overcoat may be altered to form the desired antispacer structures while the relief pattern remains entirely or sufficiently insoluble in the developing solution (e.g. insoluble relative to the solubility of the overcoat in the predetermined developer). An advantage afforded by this process is to provide a means to circumvent any need for additional steps (e.g. a freeze step) to prevent the dissolution of the relief pattern.

Various embodiments described herein include controlling photoresist contrast and photosensitivity relative to an acid-sensitive overcoat to enable efficient and facile formation of antispacer features compatible with high volume manufacturing process flows. Embodiments herein will be described in detail relative to a conventional antispacer flow that includes a freeze step. Additionally, the photosensitivity and dissolution parameters which may be leveraged for successful development will be described.

FIGS. 1A-1F illustrate a conventional antispacer process flow including a freeze step. The conventional antispacer process occurs through the dissolution of an acid-sensitive overcoat via acid diffusion from a photoresist mandrel. The conventional antispacer process flow disadvantageously results in the deprotection of the photoresist to an extent that it becomes solubilizes alongside the reacted overcoat. To prevent dissolution of the deprotected photoresist during development, an additional component or functionality must be included in the photoresist formulation to prevent dissolution along with an additional processing step.

Referring to FIG. 1A, a conventional antispacer process flow 100 includes forming a structured photoresist pattern 101 from a layer of photoresist on a substrate no using photolithography. The structured photoresist pattern 101 includes photoresist mandrels 102 separated by patterned openings 105. An additional acid source 103 is included in the photoresist (separate from the PAG used to form the photoresist mandrels 102). A process-compatible crosslinker 104 must also be included in the photoresist.

Figure 1B:
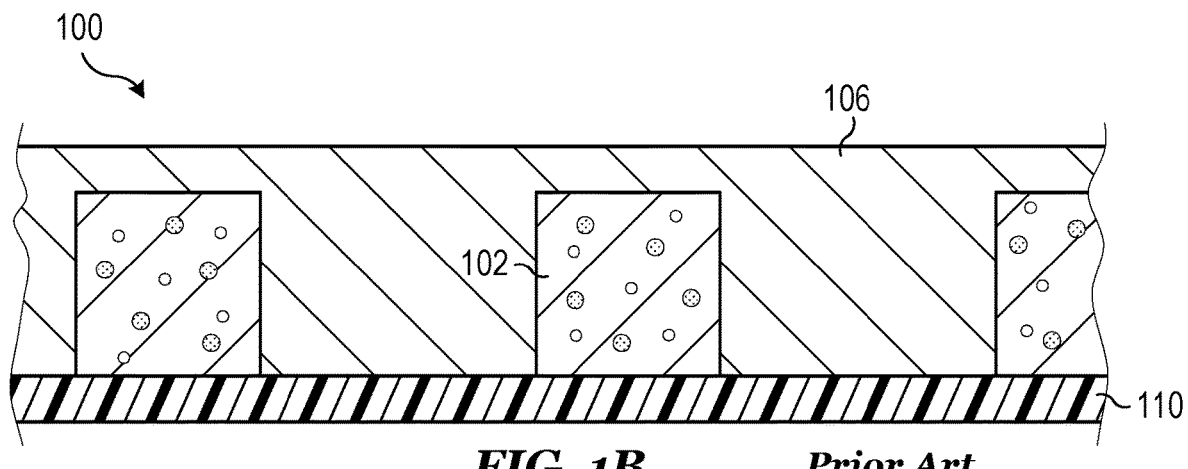
Figure 1C:
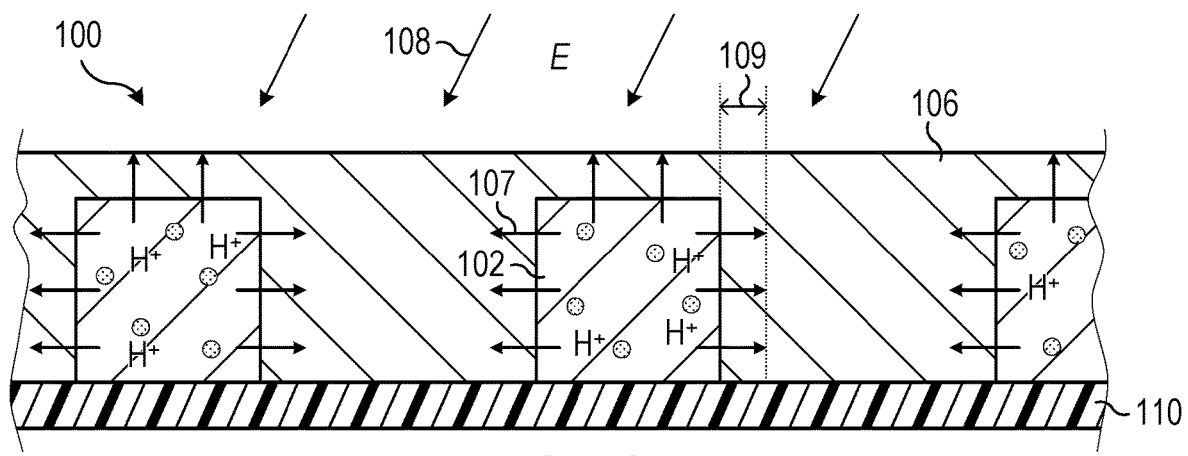

Referring now to FIG. 1B, the substrate 110 with the photoresist mandrels 102 is then coated with an acid-sensitive resin 106 cast in a solvent that will not intermix with the underlying photoresist. As illustrated in FIG. 1C, the acid source 103 within the photoresist is then activated 108 (by irradiation or baking) and the substrate 110 is baked to diffused 107 the acid into the surrounding acid-sensitive resin 106 causing solubility-changing reactions within the acid-sensitive resin 106.

Figure 1D:
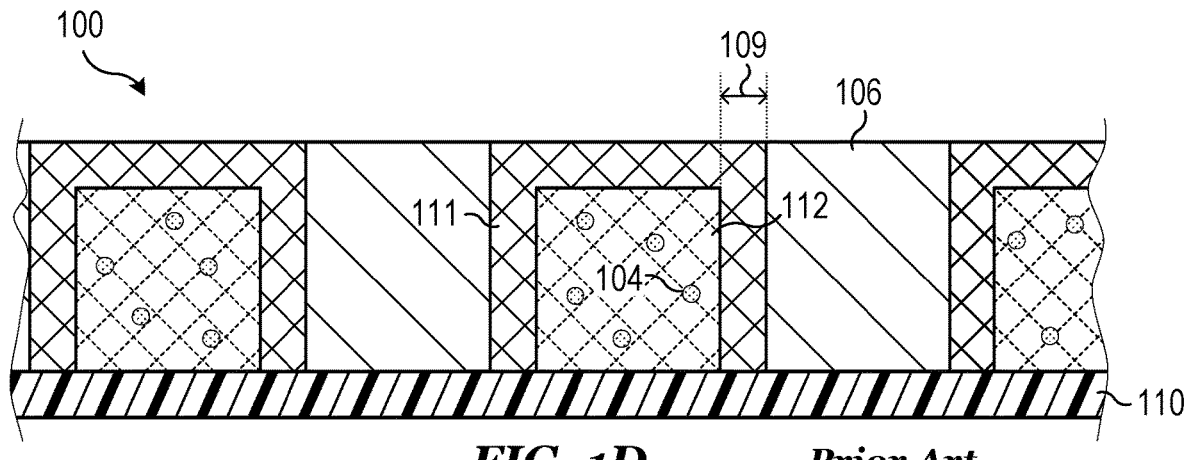
Figure 1E:
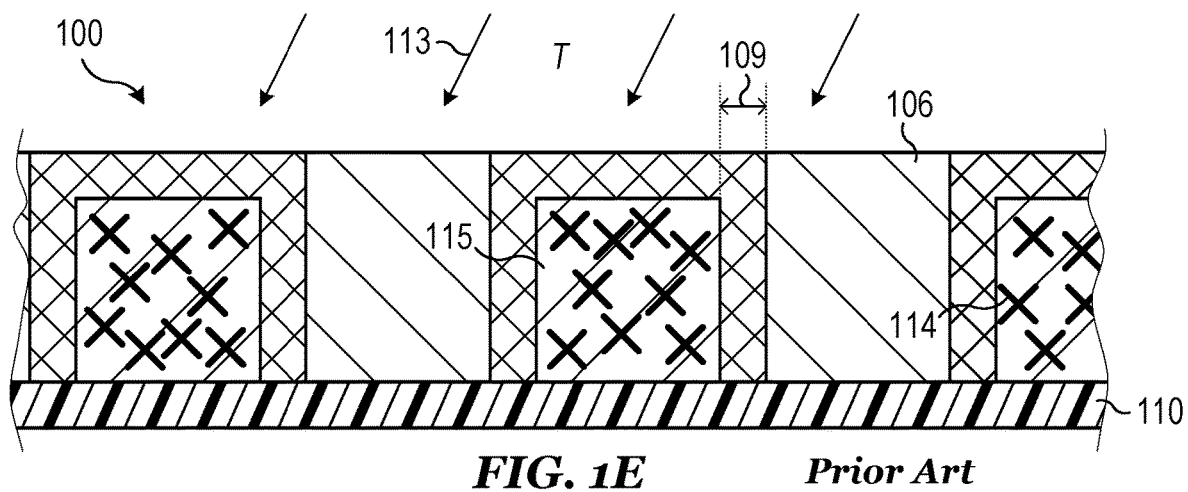

The diffusion depth 109 into the acid-sensitive resin 106 defines the CD of the antispacer features (i.e. antispacer thickness). This is illustrated in FIG. 1D by soluble resin regions in which are now soluble in an aqueous developer. However, the activation and diffusion of the acid source 103 also has the undesirable effect of solubilizing the photoresist mandrels 102 resulting in soluble photoresist mandrels 112. That is, in the conventional antispacer process flow 100, the photoresist becomes deprotected beyond a development (i.e. solubility) threshold of the photoresist in the aqueous developer.

The solubility shift of the photoresist would prevent the formation of antispacer features if the substrate 110 were developed at this stage because the soluble photoresist mandrels 112 would be removed in the developer. To address this solubility shift in the photoresist, a thermal freeze process 113 is performed to initiate a chemical reaction of the process-compatible crosslinker 104 in the photoresist that form crosslinking bonds 114 inhibiting solubility of the photoresist in the aqueous developer to form insoluble crosslinked photoresist mandrels 115.

Such a thermal freeze process, however, will result in additional acid diffusion. This additional acid diffusion must be accounted for in the available process window to achieve the desired antispacer CD. Furthermore, the development of an innate functionality in the resin or of an additive that will inhibit dissolution requires the material be thermally stable, non-reactive to strong acids, exhibit minimal absorption to the irradiating wavelength and not interfere with the patterning capabilities of the photoresist. This makes the thermal freeze process 113 more prone to defects and not a preferred patterning technique.

Figure 1F:
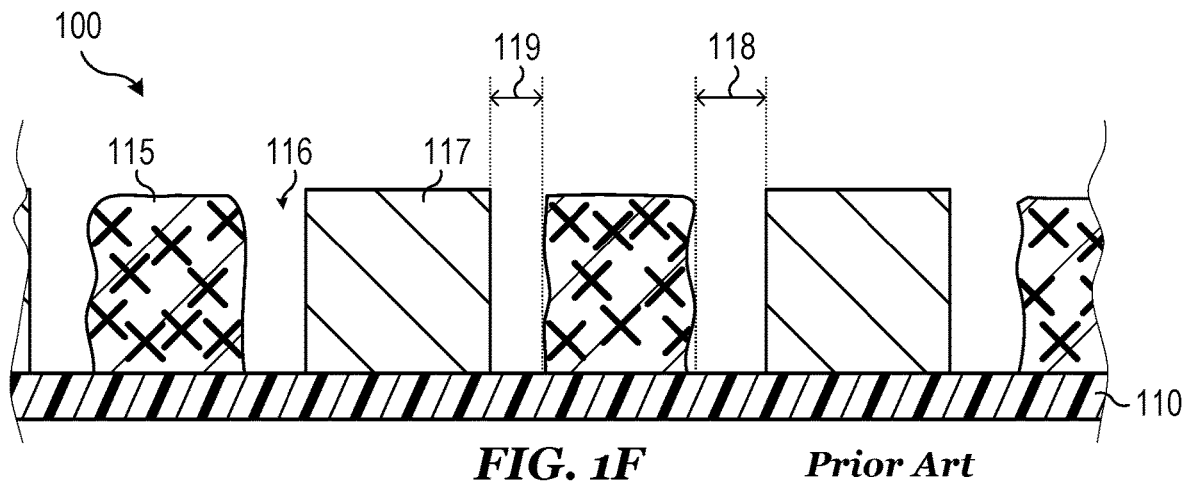

Referring now to FIG. 1F, once the acid has deprotected the acid-sensitive resin 106 to a desired depth/thickness (diffusion depth 109) and with the photoresist mandrels inhibited from dissolution, the substrate 110 is then developed in the aqueous developer to remove the soluble resin regions 111 and form conventional antispacers 116 between the insoluble crosslinked photoresist mandrels 115 and the remaining insoluble resin structures 117. Yet the additional thermal freeze process 113 to form the crosslinking bonds 114 also have the undesirable effect of producing enlarged and irregular antispacer widths (118, 119) relative to the diffusion depth 109.

The following described embodiments advantageously avoid the need for a dissolution-inhibiting step (e.g. a thermal freeze step) by instead selecting a combination of mandrel material, overcoat material, and solubility-shifting agent sufficient to achieve dissolution contrast. For example, an overcoat material may be advantageously selected such that it will achieve a sharp change in solubility at a level of deprotection well below that required of a photoresist used to form mandrels of a relief pattern thereby leaving the photoresist predominantly protected and insoluble in a predetermined developer.

Embodiments provided below describe various methods of patterning a substrate, and in particular, methods of forming antispacer features without additional dissolution-inhibiting steps. The following description describes the embodiments. FIGS. 2A-2E are used to describe an embodiment process flow for patterning a substrate to form antispacer features. Four more embodiment process flows are described using FIGS. 3A-3D, 4A-4C, 5A-5B, and 6A-6B. Solubility shifting is discussed using qualitative graphs in FIG. 7 while four potential scenarios of embodiment process flows are described using FIG. 8. Three embodiment methods are described using FIGS. 9-11.

FIGS. 2A-2E illustrates an example process flow for patterning a substrate to form antispacer features that avoids additional dissolution-inhibiting steps by activating a solubility-shifting agent to at least reach a solubility threshold of an overcoat without reaching a solubility threshold of a relief pattern in accordance with an embodiment of the invention.

Figure 2A:
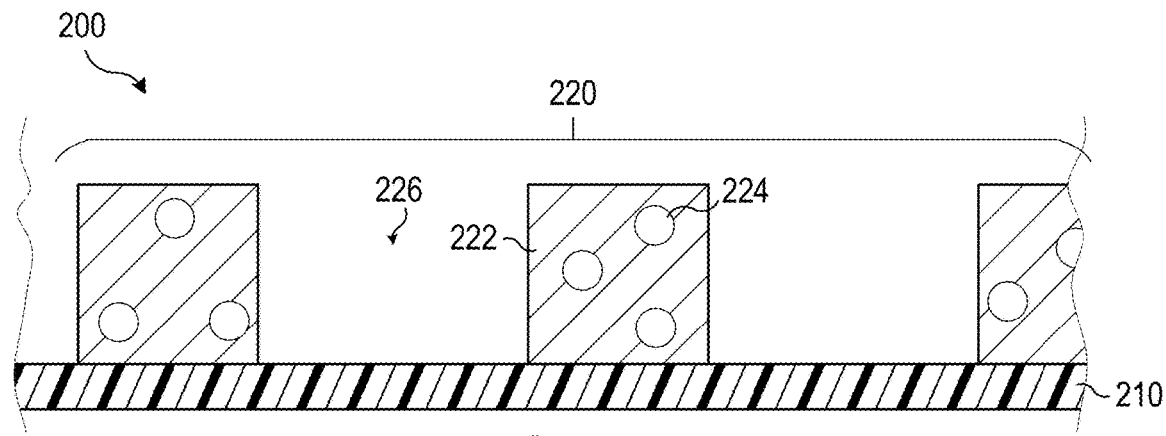
FIGS. 2A-2E illustrate an example process flow for patterning a substrate to form antispacer features that avoids additional dissolution-inhibiting steps by activating a solubility-shifting agent to at least reach a solubility threshold of an overcoat without reaching a solubility threshold of a relief pattern in accordance with an embodiment of the invention.

Referring to FIG. 2A, a process flow 200 begins with a relief pattern 220 on a substrate 210. The relief pattern 220 may be formed on the substrate 210 as part of the process flow 200 or be formed as part of a separate process and used as a starting point for the process flow 200. For example, the example process flow 200 may include forming the relief pattern 220 using a lithographic or other suitable patterning process (e.g. from a layer of photoresist using a photolithographic process). In one embodiment, the relief pattern 220 is formed on the substrate 210 from a layer of photoresist using an immersion lithography process. As a specific example, the relief pattern 220 may be formed using a 193 nm immersion lithography process.

It should be noted that here and in the following a convention has been adopted for brevity and clarity wherein elements adhering to the pattern [x10] may be related implementations of a substrate in various embodiments. For example, the substrate 210 may be similar to the substrate 110 except as otherwise stated. An analogous convention has also been adopted for other elements as made clear by the use of similar terms in conjunction with the aforementioned three-digit numbering system.

The relief pattern 220 includes structures 222 on the substrate 210 separated by openings 226. The structures 222 and openings 226 of the relief pattern 220 may be arranged in any desired pattern such as a uniform pattern of mandrels or an irregular pattern included various shapes, dimensions, and spacing. The material of the relief pattern 220 includes a solubility-shifting agent 224. The solubility-shifting agent 224 in the structures 222 has not been activated at this stage of the process flow 200. Consequently, the structures 222 are insoluble relative to a predetermined developer.

The predetermined developer may be any suitable developer. In various embodiments, the predetermined developer is an aqueous developer and comprises tetramethylammonium hydroxide (TMAH) in some embodiments.

In order to facilitate a solubility shift in the overcoat 230, diffusion of a small molecule reactive species generated by the application of energy from the solubility-shifting agent 224 may be used. The solubility-shifting agent 224 may be an acid generator such as a PAG and/or a TAG, and may also be another compound acting as an acid generator such as a PDQ. However, any suitable compound capable of imparting a solubility shift at a prescribed point in the process flow 200 may be used as the solubility-shifting agent 224. Several specific implementations of the solubility-shifting agent 224 are described below in other embodiments.

Figure 2B:
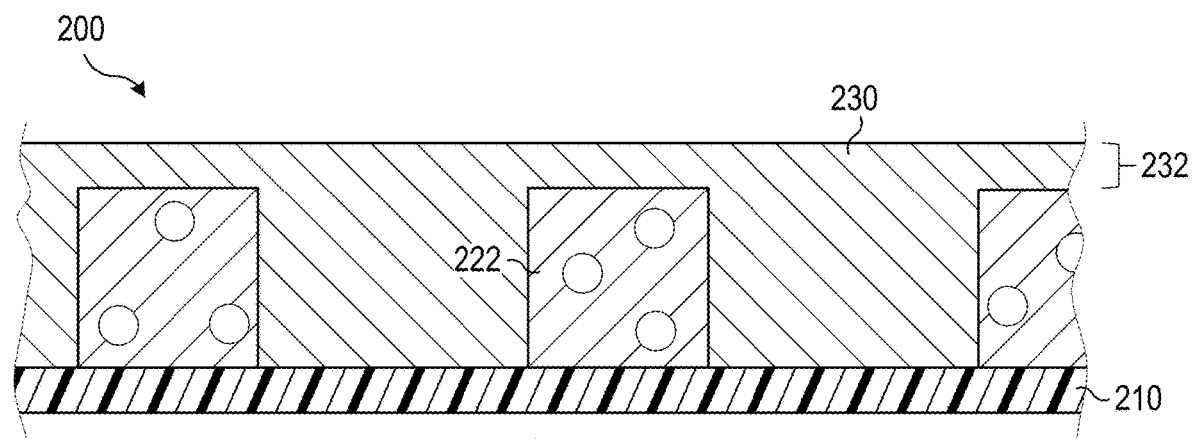

Referring now to FIG. 2B, an overcoat 230 is deposited on the substrate 210 to at least partially fill the openings 226 between the structures 222. In various embodiments, the overcoat 230 fills the openings 226. An optional overburden 232 (overcoat material residing above top surfaces of the structures 222) may result in some embodiments.

Figure 2C:
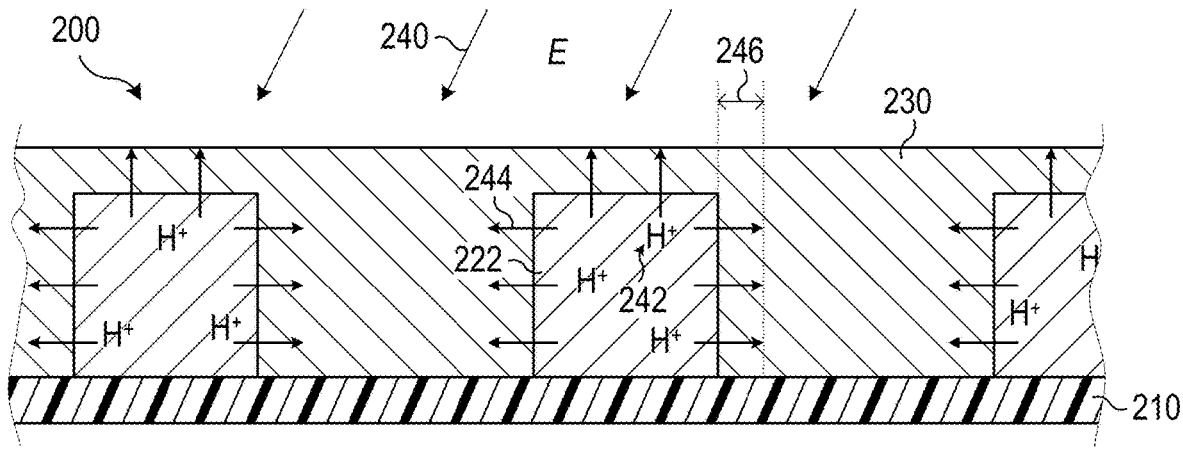
Figure 2D:
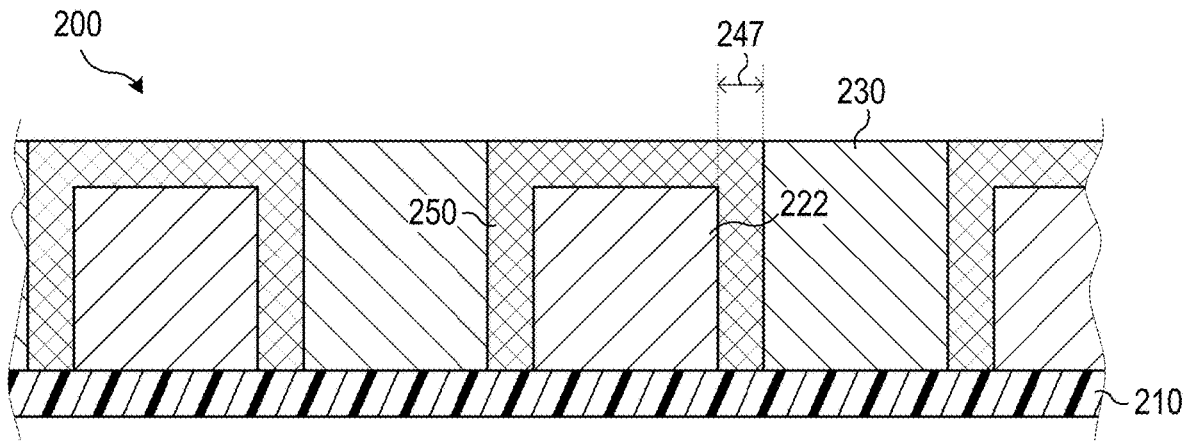

Now referring to FIG. 2C, the solubility-shifting agent 224 is activated by applying activation energy E to the relief pattern 220 to generate acid 242 which is diffuses 244 a predetermined distance 246 from the structures 222 into the overcoat 230. The predetermined distance 246 (i.e. the diffusion depth) may be controlled by any combination of diffusion variables to achieve a desired depth of diffusion which is related to the thickness of the solubilized overcoat 230. For example, possible variables that can be modified include, but are not limited to, acid molecular weight, acid concentration, bake temperature, bake time, base concentration and polymer composition.

The desired CD can be tuned through molecular weight modification of the reactive species generated from the solubility-shifting agent 224, molecular structure of the reactive species, as well as the bake temperature and bake time. Additionally, the CD can be controlled by the composition of the overcoat 230 the reactive species is diffusing into. The polarity of components within the overcoat 230 may affect acid diffusivity and the activation energy of the reactive species-sensitive component of the overcoat 230 is an additional means to control processing.

The activation energy E may take any suitable form. For example, the activation energy E may be supplied in the form of actinic radiation, thermal energy, or a combination of the two. Light (e.g. electromagnetic radiation) and heat (e.g. convective, conductive, or radiative thermal energy) generate acid from PAGs or TAGs respectively. If a PAG is to be activated, some regions or the entire substrate 210 (including all supported layers) may be irradiated at a corresponding wavelength that activates the PAG. A TAG may be activated by baking the substrate 210 to a temperature sufficient to decompose the TAG. However, the specific mechanism for activating the solubility-shifting agent 224 depends on the selected solubility-shifting agent and may also include other mechanisms. The activation and diffusion may be performed sequentially or simultaneously.

The result of the activation and diffusion of the solubility-shifting agent 224 are soluble regions 250 adjacent to the structures 222 of the relief pattern 220 which remain insoluble relative to the predetermined developer. The soluble regions 250 have a predetermined width 247 that is proportional to the predetermined distance 246. Since, the diffusion into the overcoat 230 causes the solubility shift, the predetermined width 247 of the soluble regions 250 may be equal to the predetermined distance 246 (as illustrated). However, in some cases the solubility-shifting agent 224 (e.g. generated acid) may diffuse into regions of the overcoat 230 (farthest from the structures 222) without reaching the solubility threshold of the overcoat 230. Therefore, the predetermined width 247 of the soluble regions 250 is less than or equal to the predetermined distance 246 in practice.

Figure 2E:
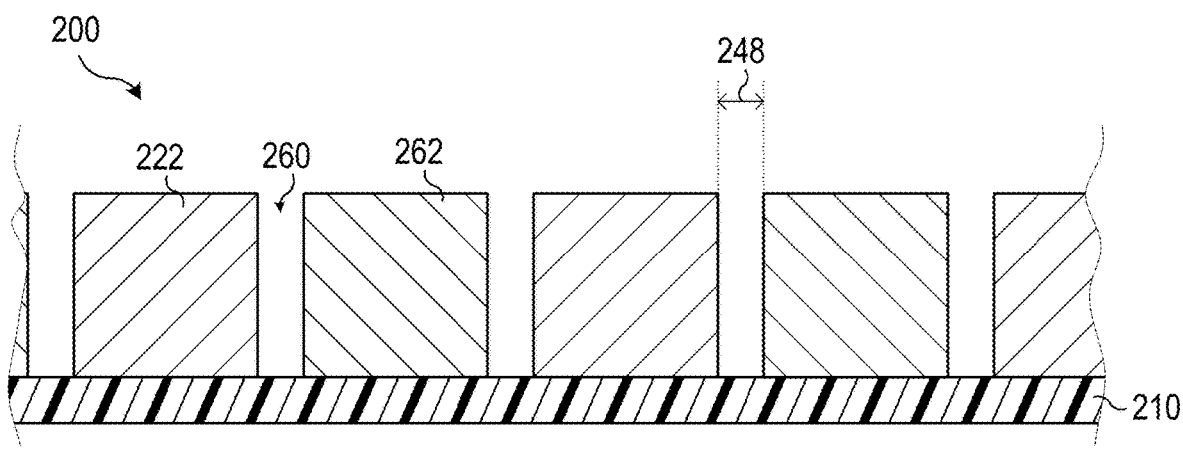

Referring now to FIG. 2E, the substrate 210 supporting the relief pattern 220 and the overcoat 230 with the soluble regions 250 is developed using the predetermined developer to form antispacer features 260. Specifically, the result of the development process are antispacer features 260 defined by the structures 222 of the original relief pattern 220 and remaining overcoat structures 262 that were not solubilized during the activation and diffusion of the solubility-shifting agent 224.

Notably and advantageously, after the activation and diffusion, no additional steps are required to prevent the structures 222 from dissolving in during development with the predetermined developer. Particularly, with the relief pattern material, the overcoat material, and the solubility-shifting agent already selected to prevent a solubility-shift in this scheme, the soluble regions 250 of the overcoat 230 can be removed without removing the structures 222.

Additionally, in contrast to the conventional antispacer process flow 100, the resulting antispacer features 260 may have an antispacer width 248 that is advantageously substantially equal to the predetermined width 247. Further, preventing the solubilizing of the structures 222 and resultant avoidance of crosslinking (or other dissolution-inhibiting process steps) may advantageously result in uniform antispacer features 260. Consequently, a smaller CD may be achievable in addition to the efficiency, compatibility, and simplicity that are afforded from the process flow 200.

The type of materials selected for the structures 222 of the relief pattern 220 (e.g. photoresist), the overcoat 230 (e.g. a resin), and the solubility-shifting agent 224 (a PAG, TAG, PDQ, etc.) may affect the process flow 200. For example, selections can be made which can maximize the selectivity between the deprotection rates of the relief pattern material compared to the overcoat material. In one embodiment, the overcoat 230 comprises a developable bottom anti-reflective coating (dBARC). The dBARC may advantageously de-crosslink in the presence of a low acid concentration (relative to an acid concentration necessary to deprotect the relief pattern material, for example).

The activation energy of a deprotectable monomer within the relief pattern 220 may be high relative to the overcoat 230 to allow for higher deprotection kinetics within the overcoat 230 relative to the structures 222. In some embodiments, the relief pattern 220 comprises a high activation energy leaving group such as methyl adamantyl methacrylate (MAMA), isoadamantyl methacrylate (IAM), or tert-Butyl acrylate (TBA).

The activation energy of a deprotectable monomer included in the overcoat material may affect the choice of relief pattern material. For example, if the overcoat 230 comprises a deprotectable monomer with a low activation energy such as a monomer with an acetal functionality such as i-butoxyethyl methacrylate (BEMA) or a low activation ester functionality such as tert-Butyl cyclopentyl methacrylate (TBCPMA), then the activation energy of the relief pattern material may be lower than adamantyl methacrylate, such as that found with the ethyl cyclopropyl methacrylate (ECPMA) leaving group.

Remaining monomers in the relief pattern may be used for line formation and etch pattern transfer specifications. Conventional monomers used in standard lithographic patterning can be selected for this purpose. In some embodiments, the overcoat 230 is transparent over a range of wavelengths (e.g. so that actinic radiation within the range can pass through the overcoat). However, this is not a requirement of the overcoat 230.

FIGS. 3A-3D illustrate an example process flow for patterning a substrate to form antispacer features where a solubility-shifting agent is utilized as a TAG when solubilizing an overcoat material in accordance with an embodiment of the invention. The process flow of FIGS. 3A-3D may be a specific implementation of other process flows or various stages of other process flows described herein such as the process flow of FIGS. 2A-2E, for example. Similarly labeled elements may be as previously described.

Referring to FIGS. 3A-3D, a process flow 300 optionally includes forming a relief pattern 320 on a substrate 310. To form the relief pattern 320, a layer of photoresist 327 supported by the substrate 310 is exposed to actinic radiation 321. The exposure activates a PAG 325 included along with a TAG 324 (a solubility-shifting agent) in the layer of photoresist 327. The PAG 325 is sensitive to a wavelength $\lambda$ that is included in the spectrum of the actinic radiation 321. The layer of photoresist 327 is exposed to the actinic radiation 321 through a photomask 323 (or obscured by opaque structures formed on the layer of photoresist 327) to form a latent pattern in the layer of photoresist 327.

Figure 3A:
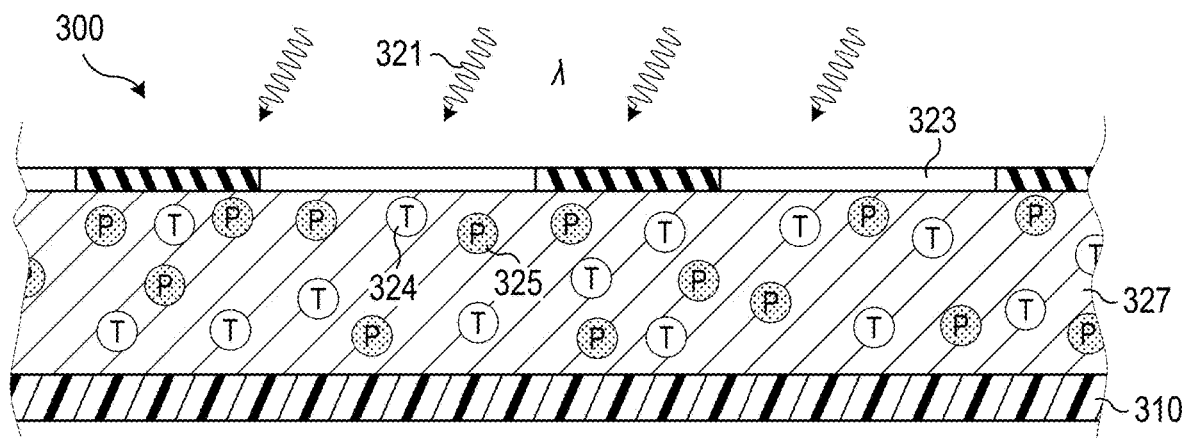
FIGS. 3A-3D illustrate an example process flow for patterning a substrate to form antispacer features where a solubility-shifting agent is utilized as a thermal acid generator when solubilizing an overcoat material in accordance with an embodiment of the invention.
Figure 3B:
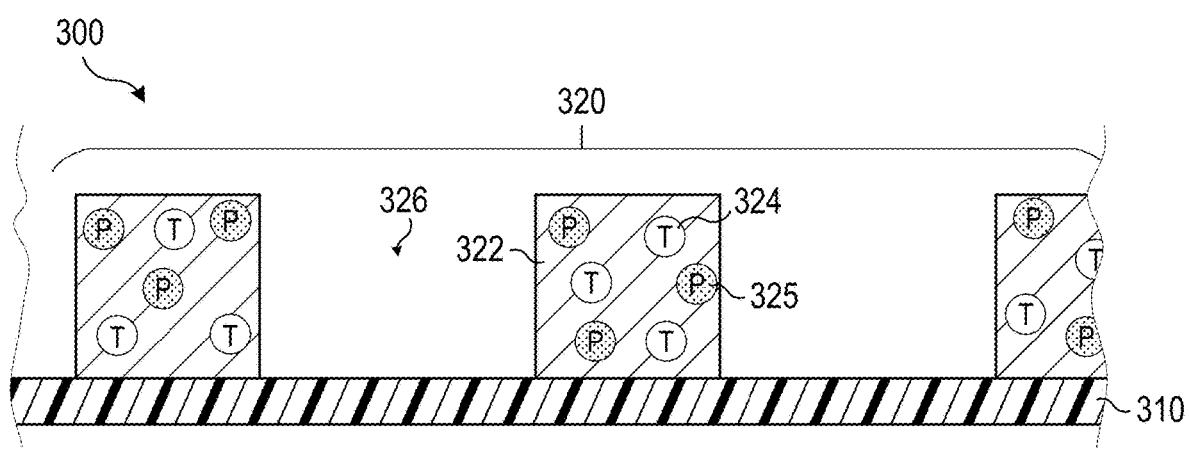

A relief pattern 320 including structures 322 separated by openings 326 is formed by developing the substrate 310 to remove the latent pattern (FIG. 3B). Alternatively, the process flow 300 may begin with the relief pattern 320 already formed. The structures 322 include both the TAG 324 which was not activated by the actinic radiation 321 and the PAG 325 which was shielded from the actinic radiation 321 by the photomask 323. As a result, the structures 322 are insoluble relative to a predetermined developer at this stage of the process flow 300.

Figure 3C:
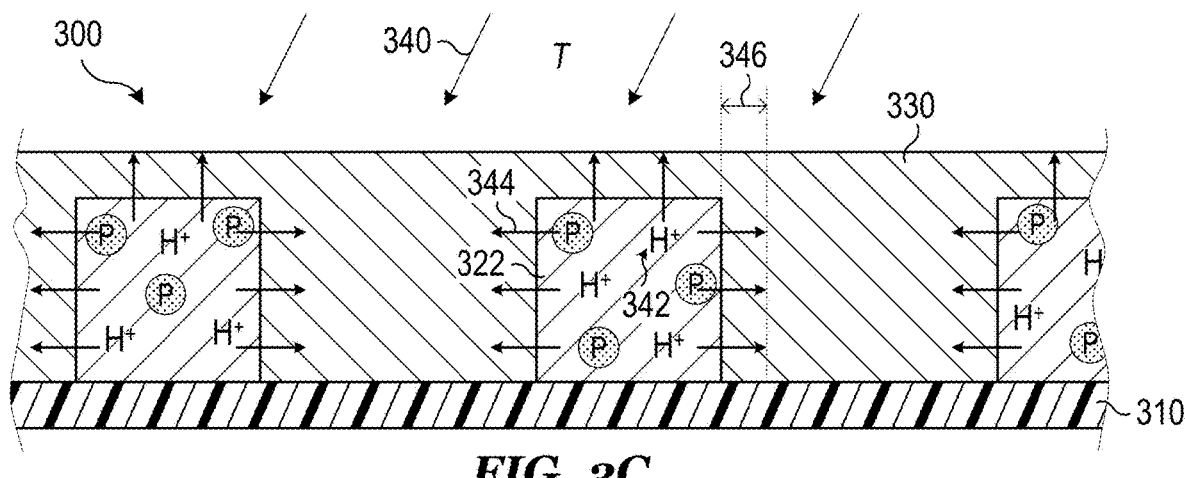

As illustrated in FIG. 3C, the TAG 324 is activated to generate an acid 342 that is diffused 344 a predetermined distance 346 by applying heat 340 having a predetermined temperature T to the substrate 310 including an overcoat 330 formed over the relief pattern 320. Notably, the PAG 325 is still present in the structures 322, but is not activated by the applied heat 340. The diffusion process may also be promoted partially or entirely using a separate application of heat (e.g. a bake that uses different parameters, such as duration and/or temperature, than heat 340 applied to activate the TAG 324).

Figure 3D:
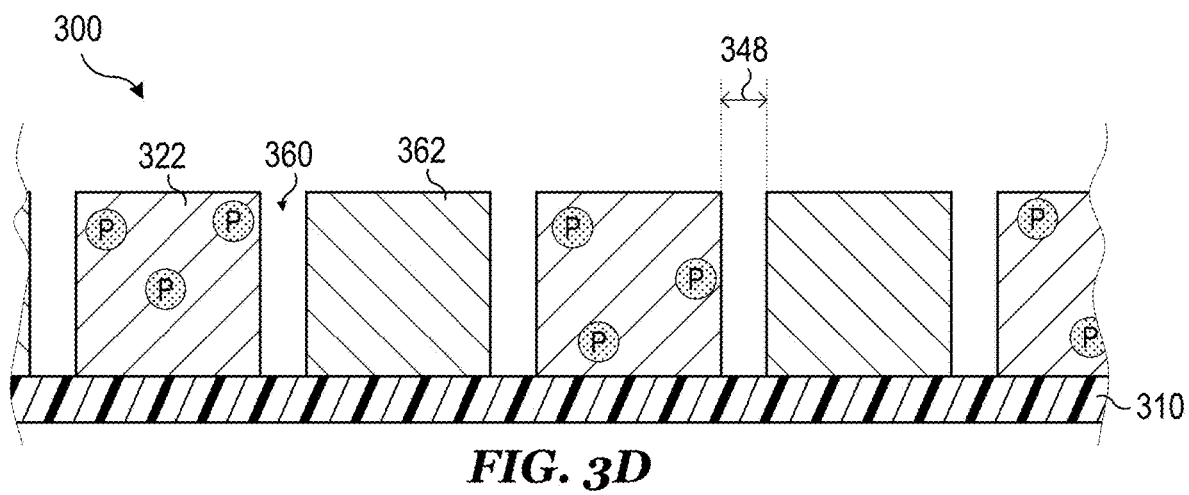

Antispacer features 360 with antispacer width 348 are then formed by developing the substrate 310 supporting the relief pattern 320 and the overcoat 330 using the predetermined developer (FIG. 3D). Specifically, the result of the development process are antispacer features 260 defined by the structures 322 of the original relief pattern 320 and remaining overcoat structures 362 that were not solubilized during the activation and diffusion of the TAG 324. The PAG 325 was not activated during the application of heat 340 and the activated TAG 324 is insufficient to solubilize the photoresist of the structures 322, but sufficient to solubilize regions of the overcoat 330 to which an appropriate amount of acid is diffused. For example, the solubility threshold of the photoresist of the relief pattern 320 may be sufficiently higher than the solubility threshold of the overcoat 230. Additionally or alternatively, the acid 342 may be a weak acid that is not capable of significant deprotection of the photoresist.

The use of the TAG 324 as a secondary source of acid may advantageously be significant variable for tuning selectivity because the strength of the acid generated may be selected to allow for reaction with the overcoat 330 while minimally reacting with the photoresist of the relief pattern 320 at a given process temperature T.

As described above, both a PAG and TAG may be included in the formulation of a bottom layer of photoresist. In this specific example, the PAG is intended to deprotect the photoresist upon initial light exposure and subsequent bake and develop steps to form the initial relief pattern on the substrate. The TAG is subsequently activated thermally at a temperature higher than that of the relief pattern post-exposure bake (PEB).

Figure 4A:
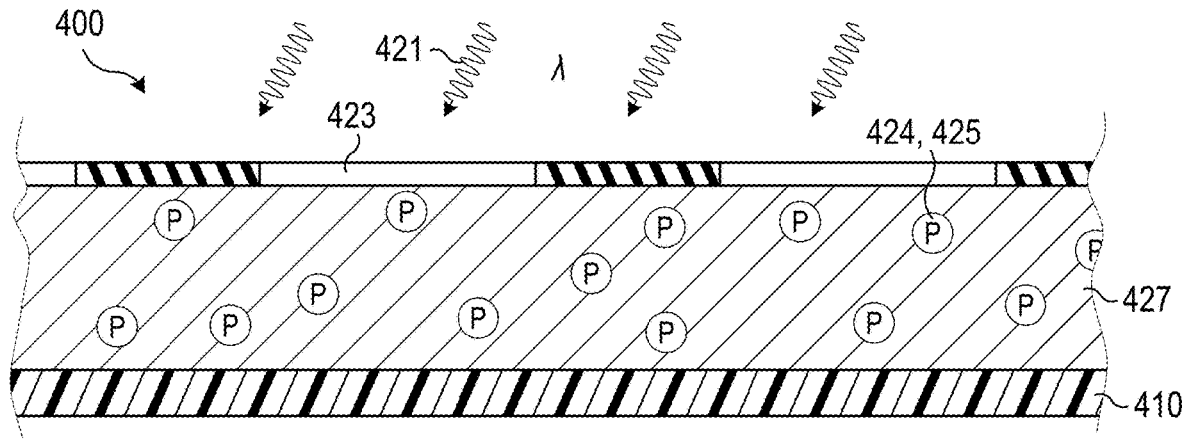
FIGS. 4A-4C illustrate an example process flow for patterning a substrate to form antispacer features where a solubility shifting agent is utilized as a photoacid generator when forming a relief pattern and as a thermal acid generator when solubilizing an overcoat material in accordance with an embodiment of the invention.
Figure 4B:
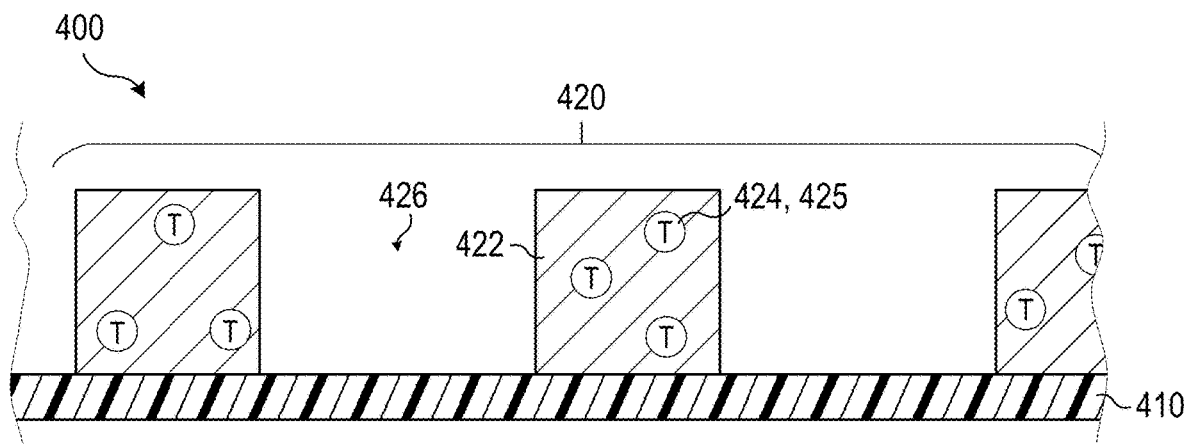
Figure 4C:
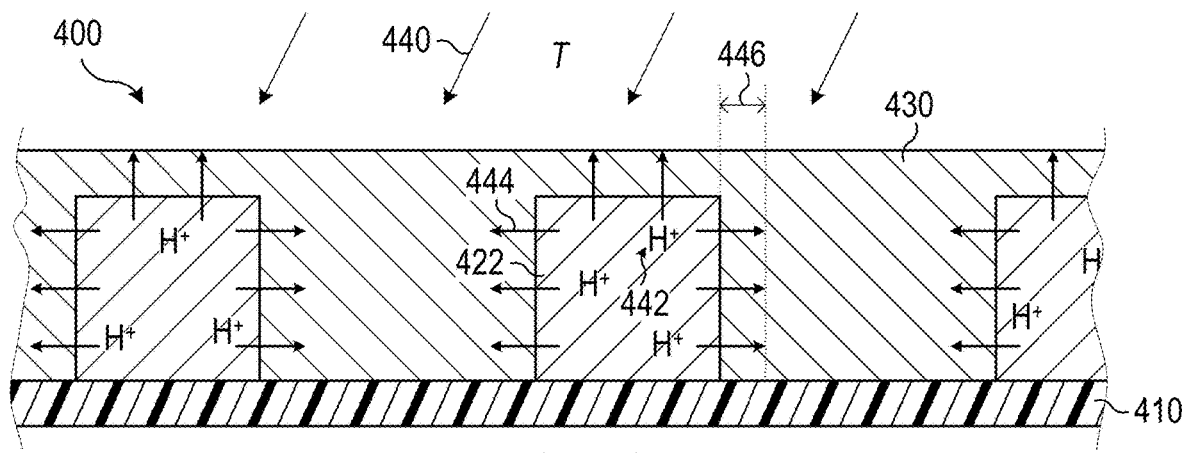

FIGS. 4A-4C illustrate an example process flow for patterning a substrate to form antispacer features where a solubility shifting agent is utilized as a PAG when forming a relief pattern and as a TAG when solubilizing an overcoat material in accordance with an embodiment of the invention. The process flow of FIGS. 4A-4C may be a specific implementation of other process flows or various stages of other process flows described herein such as the process flow of FIGS. 2A-2E, for example. Similarly labeled elements may be as previously described.

Referring to FIGS. 4A-4C, a process flow 400 is similar to the process flow 300 of FIGS. 3A-3D except that an additional TAG is not required because a PAG 425 included in a layer of photoresist 427 that is used to generate a relief pattern 420 on a substrate 410 also acts as a TAG 424 at higher temperatures.

The exposure of actinic radiation 421 (including wavelength $\lambda$) through a photomask 423 activates the PAG 425 to form a latent pattern in the layer of photoresist 427. As before, the relief pattern 420 including structures 422 separated by openings 426 is formed by developing the substrate 410 to remove the latent pattern (FIG. 4B). The structures 422 include the PAG 425 (TAG 424) which was not activated by the actinic radiation 421 due to being shielded from the actinic radiation 421 by the photomask 423. As a result, the structures 422 are insoluble relative to a predetermined developer at this stage of the process flow 400.

As illustrated in FIG. 4C, the TAG 424 is activated to generate an acid 442 that is diffused 444 a predetermined distance 446 by applying heat 440 having a predetermined temperature T to the substrate 410 including an overcoat 430 formed over the relief pattern 420. Antispacer features are then formed by developing the substrate 410 supporting the relief pattern 420 and the overcoat 430 using the predetermined developer.

In this specific example, the PAG 425 functions to deprotect the photoresist upon initial light exposure and subsequent bake and develop steps to form the initial relief pattern on the substrate, but then subsequently functions as a TAG (the TAG 424) at a temperature higher than that of the relief PEB.

Figure 5A:
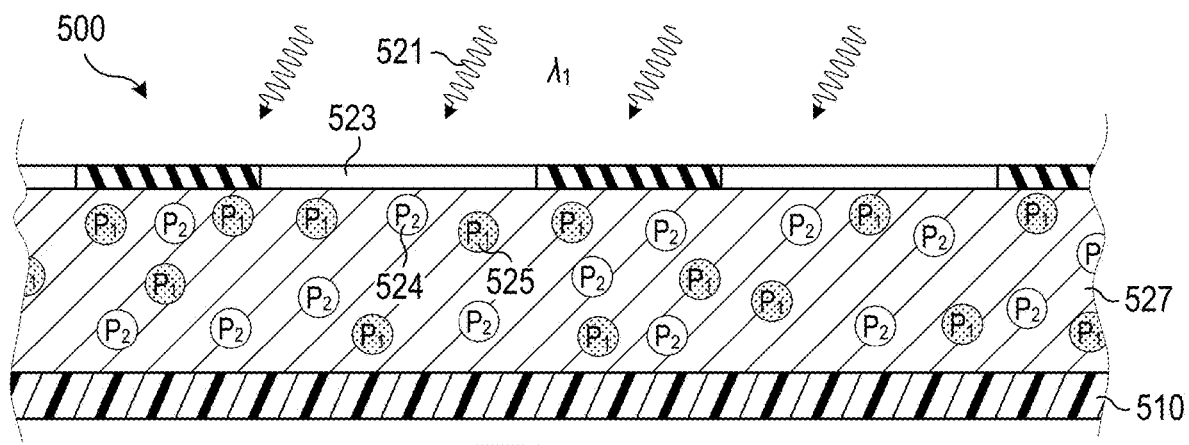
FIGS. 5A and 5B illustrate an example process flow for patterning a substrate to form antispacer features where a solubility shifting agent is utilized as a photoacid generator when solubilizing an overcoat material in accordance with an embodiment of the invention.
Figure 5B:
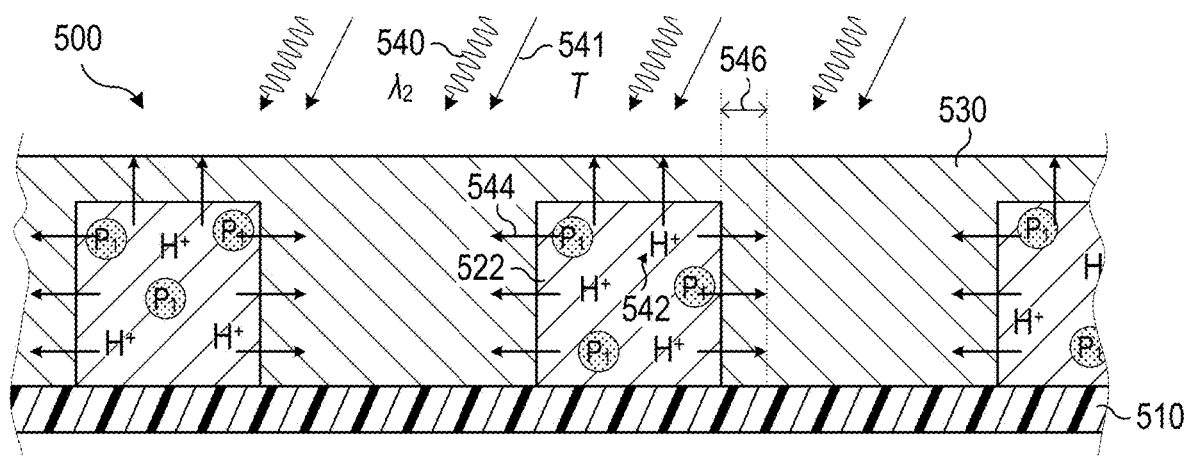

FIGS. 5A and 5B illustrate an example process flow for patterning a substrate to form antispacer features where a solubility shifting agent is utilized as a PAG when solubilizing an overcoat material in accordance with an embodiment of the invention. The process flow of FIGS. 5A and 5B may be a specific implementation of other process flows or various stages of other process flows described herein such as the process flow of FIGS. 2A-2E, for example. Similarly labeled elements may be as previously described.

The previous two process flows describe a solubility-shifting agent that functions as a TAG to form soluble regions in an overcoat. Alternatively, another PAG activated at a different wavelength than a PAG used to form the initial relief pattern may be used. For example, the polymer in the overcoat layer may have a deprotectable monomer that is activated with a weaker acid than a deprotectable monomer in the photoresist of the relief pattern. This composition may advantageously facilitate little or no change in the CD of the initial structures of the relief pattern while enabling facile solubilizing of the overcoat layer. Examples of deprotectable monomers (solubility-switching groups) that react at lower temperatures or with weaker acids compared to the initial relief pattern are low activation energy ester leaving groups, such as those mentioned above, and acetal leaving groups.

Referring to FIG. 5A, a process flow 500 includes a layer of photoresist 527 disposed on a substrate 510. Both a first PAG 525 and a second PAG 524 are included in the layer of photoresist 527 which is exposed to actinic radiation 521 including a first wavelength $\lambda_1$ through a photomask 523. As illustrated in FIG. 5B, an overcoat 530 is then exposed to actinic radiation 540 including a second wavelength $\lambda_2$ (different from the first wavelength $\lambda_1$) which activates the second PAG 524 but does not activate the first PAG 525 remaining in the structures 522 of the relief pattern. The overcoat 530 is transparent to the second wavelength $\lambda_2$. Heat 541 (e.g. energy supplied for diffusion) may also be applied to diffuse 544 acid 542 generated from the second PAG 524 into the overcoat 530. The heat 541 may be applied before, during and/or after applying the actinic radiation 540 including the second wavelength $\lambda_2$.

Figure 6A:
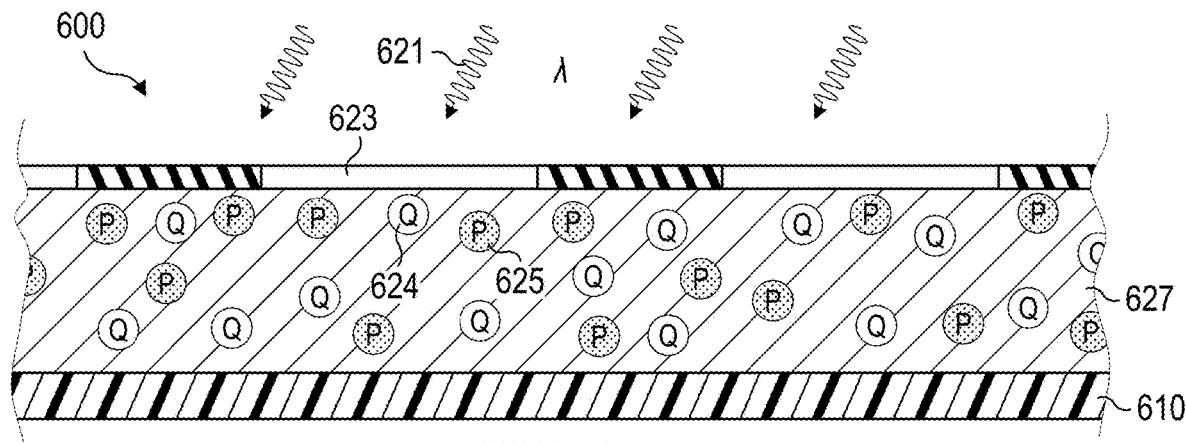
FIGS. 6A and 6B illustrate an example process flow for patterning a substrate to form antispacer features where a photodestroyable quencher is utilized as a solubility shifting agent when solubilizing an overcoat material in accordance with an embodiment of the invention.
Figure 6B:
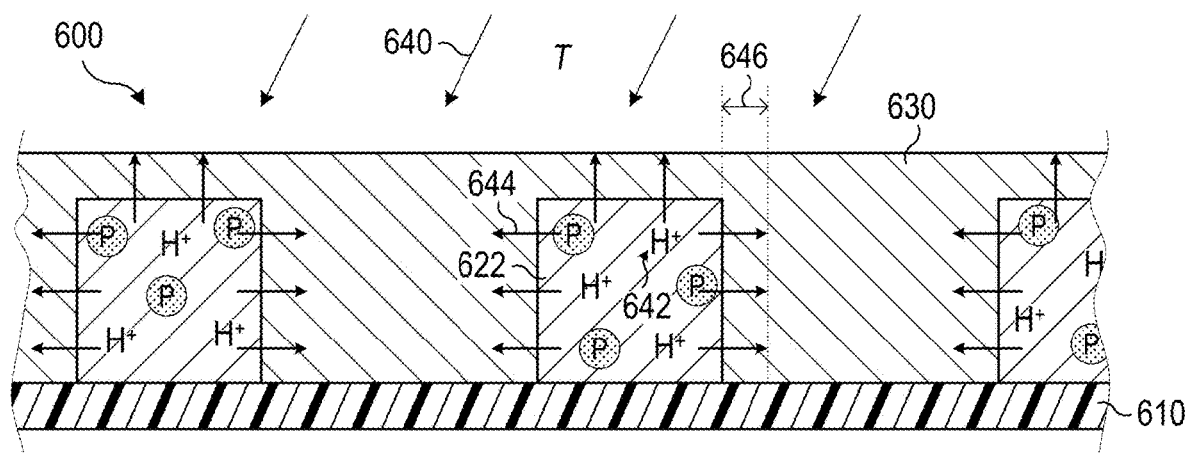

FIGS. 6A and 6B illustrate an example process flow for patterning a substrate to form antispacer features where a PDQ is utilized as a solubility shifting agent when solubilizing an overcoat material in accordance with an embodiment of the invention. The process flow of FIGS. 6A and 6B may be a specific implementation of other process flows or various stages of other process flows described herein such as the process flow of FIGS. 2A-2E, for example. Similarly labeled elements may be as previously described.

Referring to FIGS. 6A and 6B, a process flow 600 is similar to the process flow 300 of FIGS. 3A-3D except that the additional TAG included in a layer of photoresist 627 used to generate a relief pattern 620 on a substrate 610 is also a PDQ 624 that is employed as a quencher during formation of the relief pattern 620. As before, the layer of photoresist 627 including a PAG 625 and the PDQ 624 is exposed to actinic radiation 621 including a wavelength $\lambda$ through a photomask 623. As illustrated in FIG. 6B, heat 640 is applied to an overcoat 630 which activates and diffuses 644 the PDQ 624 to generate an acid 642 strong enough to deprotect the overcoat 630.

In order to facilitate activation of the PDQ 624 without activation of the PAG 625 (e.g. still in the relief pattern 620), differentiation between conditions sufficient to activate the PDQ 624 and the PAG 625 may be used. For example, the PDQ 624 may generate a weak acid while the PAG 625 may generate a strong acid. If the stronger PAG 625 is activated the desired selectivity may not be achieved. The differentiation between the activation conditions for the PDQ 624 and the PAG 625 is a wavelength difference in one embodiment and is a thermal difference in another embodiment.

In various embodiments, the PDQ 624 is a camphorsulfonic acid PDQ. In the presence of a superacid in the relief pattern, the camphorsulfonic acid salt acts as a quencher due to pKa differences with the superacid. Diffusing camphorsulfonic acid into the overcoat 630 (e.g. containing acetal functionality) may facilitate reaction with the polymer to form a soluble material in the regions it diffuses into. Camphorsulfonic acid may also deprotect low activation energy esters such as TBCPMA at slightly elevated temperatures.

Figure 7:
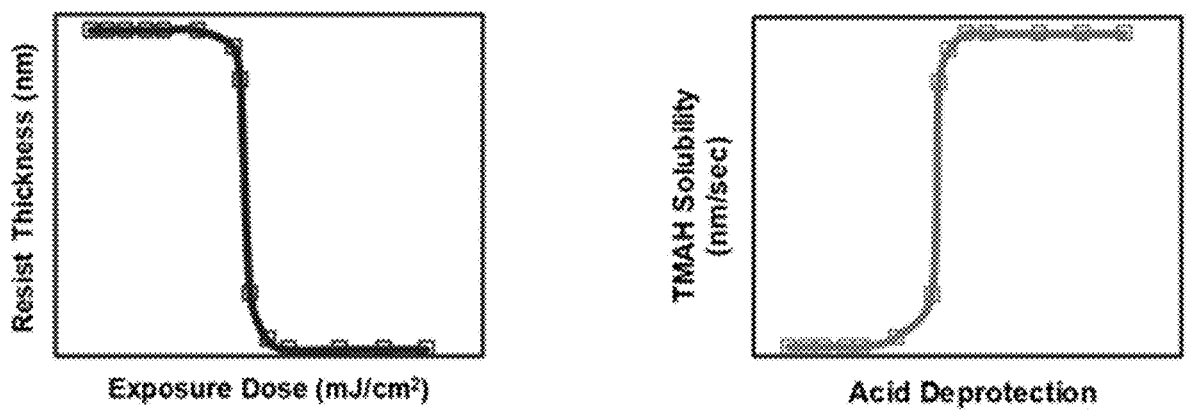
FIG. 7 illustrates two qualitative graphs where the left graph illustrates an example relationship between resist thickness and exposure dose and where the right graph illustrates an example relationship between solubility and deprotection in accordance with an embodiment of the invention.

FIG. 7 illustrates two qualitative graphs where the left graph illustrates an example relationship between resist thickness and exposure dose and where the right graph illustrates an example relationship between solubility and deprotection in accordance with an embodiment of the invention.

Chemically-amplified photoresists (CAR) undergo a solubility shift upon exposure to a specific wavelength of light via acid-catalyzed deprotection of the polymer resin by acid generated from PAG decomposition. A metric of a high performance photoresist is a large dissolution contrast which is often represented by a plot of photoresist thickness vs. exposure dose, also known as a contrast curve. In a positive photoresist, when achieving a specific threshold of polymer de-protection any excess de-protection dramatically and non-linearly increases the solubility of the film in aqueous developer as illustrated in FIG. 7.

The techniques described herein function by selecting or formulating the overcoat and photoresist such that the overcoat will exceed its deprotection threshold (solubility threshold) within a process window before the photoresist becomes deprotected.

Figure 8:
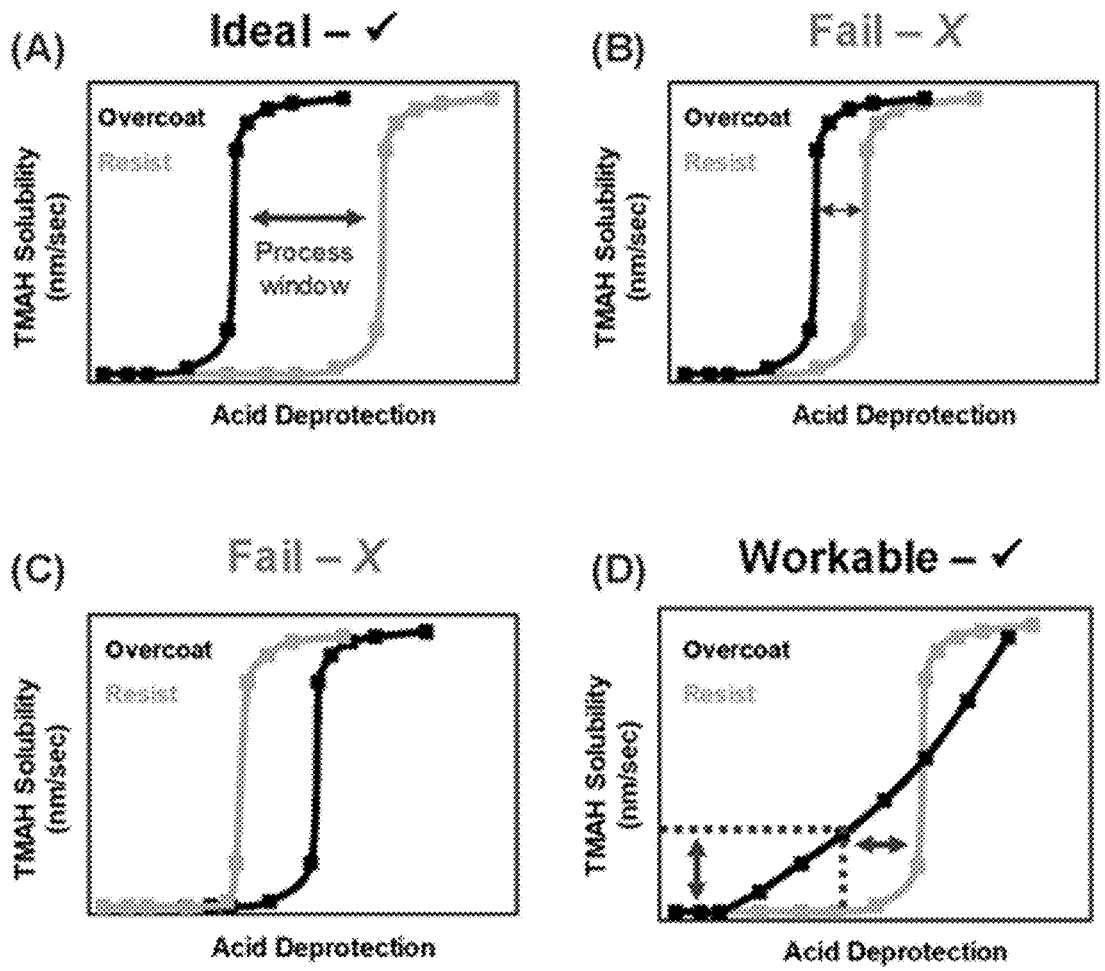
FIG. 8 illustrates four qualitative graphs of potential scenarios in which the dissolution contrast and sensitivity of the photoresist and overcoat are considered in accordance with embodiments of the invention.

FIG. 8 illustrates four qualitative graphs of potential scenarios in which the dissolution contrast and sensitivity of the photoresist and overcoat are considered in accordance with embodiments of the invention.

Graph (A) illustrates an ideal scenario in which the overcoat exhibits high dissolution contrast with a deprotection threshold (solubility threshold) well below that of the photoresist such that complete dissolution of the overcoat can be attained before the solubility of the photoresist is affected. A photoresist with higher dissolution contrast will provide a wider process margin.

Graph (B) is a similar scenario to graph (A); however the critical deprotection thresholds of the overcoat and photoresist begin to overlap preventing the reproducible dissolution of the de-protected overcoat with retention of the photoresist mandrel. Variables, including but not limited to, acid strength, developer concentration, polymer composition, bake temperature and bake time may be adjusted to increase the process window between the two deprotectable films so that the ideal scenario of graph (A) may be approached or achieved.

Graph (C) illustrates a scenario in which the photoresist is more sensitive than the overcoat resulting in complete dissolution of the photoresist prior to critical de-protection of the overcoat. This system would require a freeze step and functionality within the photoresist to prevent dissolution of the de-protected resin.

Graph (D) is an example of a system in which the overcoat exhibits low dissolution contrast and high sensitivity relative to the photoresist. This system may advantageously achieve reproducible sub-resolution antispacer features if two process windows are considered. In one process window, the dissolution rate of the deprotected overcoat relative to the protected overcoat is sufficient to clear the antispacer region while retaining the surrounding overcoat. In a second process window, the degree of acid deprotection required to solubilize the overcoat results in minimal dissolution of the photoresist for which the structures of the relief pattern will be retained after the antispacer is solubilized.

Various compositions can be selected for use with processes herein. Overcoat compositions may be polymer resins, and the resins may be made up of multiple monomer types. A majority of the monomers within the overcoat may be similar in structure to that of the photoresist so that both films have similar etch rates.

The aspect of the overcoat that defines a solubility contrast relative to the photoresist is the composition of the acid-sensitive monomer. To maximize the selectivity, the ratio of the activation energy between the resist and overcoat sufficient to undergo the solubility-changing reaction should be high. Accordingly, the photoresist may have a higher activation energy deprotectable monomer such as MAMA or TBA. The overcoat may then have a lower activation energy monomer such as an acetal, ECPMA, or another low activation energy ester functionality (e.g. even lower than ECPMA).

As can be appreciated by those of skill in the art, other chemical combinations can be selected for use herein. The overcoat material may have a small dissolution rate $R_{min}$ in TMAH that allows the development of the soluble region in the overcoat. To generate unexposed film thickness loss in the overcoat, a monomer with inherent TMAH solubility may be used. An example of this is the inclusion of one of the following monomers as examples: dihexafluoro alcohol (DiHFA), methyl methacrylate (MAA), and phenol.

As mentioned above, to simplify the formulation of the relief pattern material, it may be advantageous to incorporate a very low activation energy deprotectable monomer in the overcoat layer such as an acetal or a low activation energy ester. This may advantageously allow weak acid components used in the formation of the relief pattern to diffuse into the overcoat and induce a switch in solubility in the regions activated by acid diffusion. Many PAGs also act as TAGs at higher temperatures as they reach their thermal decomposition. Therefore, in some formulations, no additional TAG is required in the relief pattern material.

Figure 9:
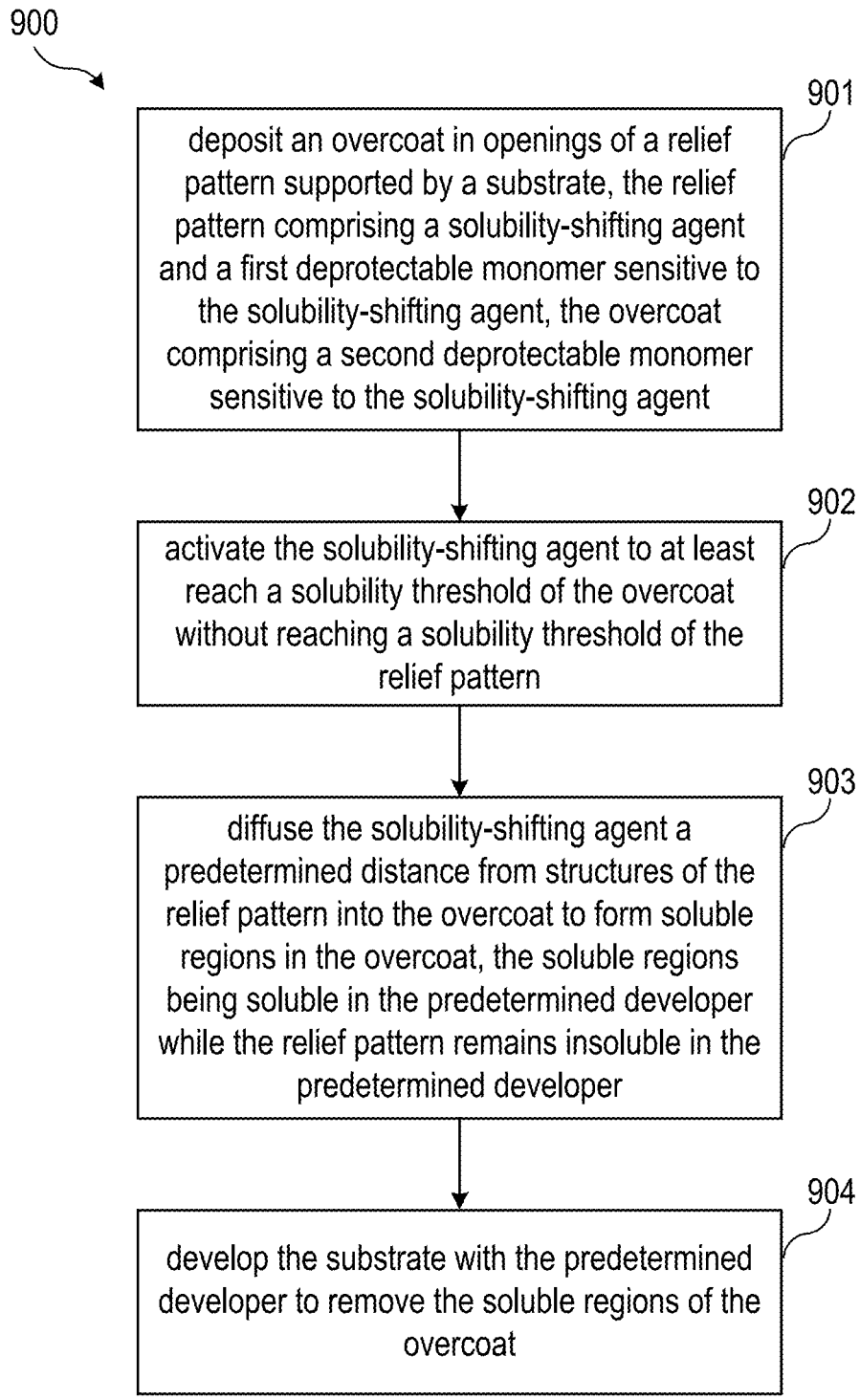
FIG. 9 illustrates an example method of patterning a substrate in accordance with an embodiment of the invention.

FIG. 9 illustrates an example method of patterning a substrate in accordance with an embodiment of the invention. The method of FIG. 9 may be combined with other methods and performed using the systems and apparatuses as described herein. For example, the method of FIG. 9 may be combined with any of the embodiments of FIGS. 2A-8. Although shown in a logical order, the arrangement and numbering of the steps of FIG. 9 are not intended to be limiting. The method steps of FIG. 9 may be performed in any suitable order or concurrently with one another as may be apparent to a person of skill in the art.

Referring to FIG. 9, step 901 of a method 900 of patterning a substrate includes depositing an overcoat in openings of a relief pattern supported by a substrate. The relief pattern may include a solubility-shifting agent and a first deprotectable monomer sensitive to the solubility-shifting agent. The overcoat may include a second deprotectable monomer sensitive to the solubility-shifting agent. The relief pattern has a first solubility threshold relative to a predetermined developer while the overcoat has a second solubility threshold relative to the predetermined developer. The second solubility threshold is lower than the first solubility threshold.

Step 902 includes activating the solubility-shifting agent to at least reach the second solubility threshold of the overcoat without reaching the first solubility threshold of the relief pattern. The solubility-shifting agent is diffused a predetermined distance from structures of the relief pattern into the overcoat to form soluble regions in the overcoat in step 903. The soluble regions are soluble in the predetermined developer while the relief pattern remains insoluble in the predetermined developer. Steps 902 and 903 may be performed simultaneously, separately, or partially overlapping. The substrate is developed with the predetermined developer to remove the soluble regions of the overcoat in step 904.

Figure 10:
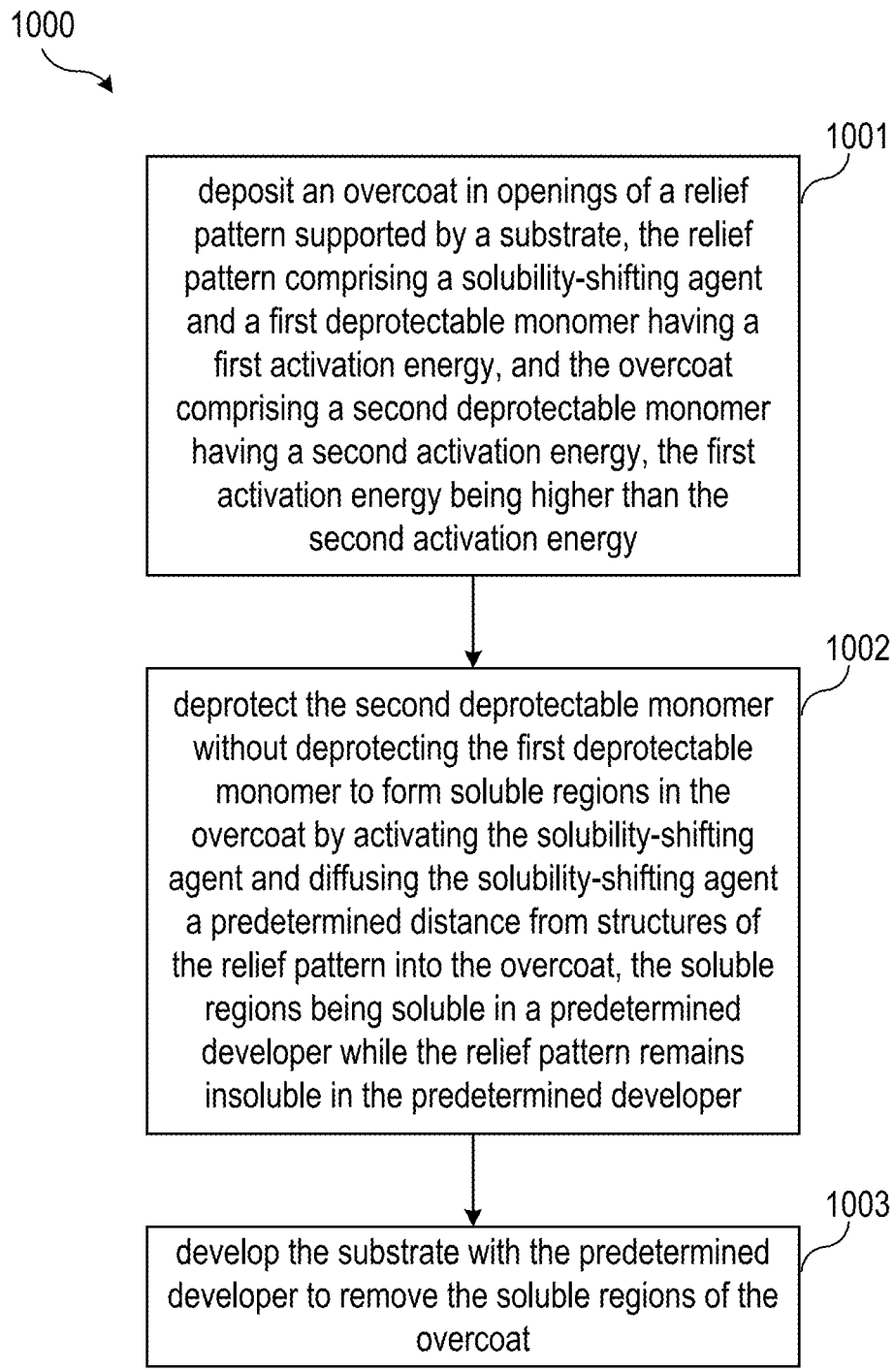
FIG. 10 illustrates an example method of patterning a substrate in accordance with an embodiment of the invention.

FIG. 10 illustrates an example method of patterning a substrate in accordance with an embodiment of the invention. The method of FIG. 10 may be combined with other methods and performed using the systems and apparatuses as described herein. For example, the method of FIG. 10 may be combined with any of the embodiments of FIGS. 2A-8. Additionally, the method of FIG. 10 may be combined with the method of FIG. 9, for example. Although shown in a logical order, the arrangement and numbering of the steps of FIG. 10 are not intended to be limiting. The method steps of FIG. 10 may be performed in any suitable order or concurrently with one another as may be apparent to a person of skill in the art.

Referring to FIG. 10, step 1001 of a method 1000 of patterning a substrate includes depositing an overcoat in openings of a relief pattern supported by a substrate. The relief pattern includes a solubility-shifting agent and a first deprotectable monomer having a first activation energy while the overcoat includes a second deprotectable monomer having a second activation energy. The first activation energy is higher than the second activation energy.

In step 1002, the second deprotectable monomer is deprotected without deprotecting the first deprotectable monomer to form soluble regions in the overcoat by activating the solubility-shifting agent and diffusing the solubility-shifting agent a predetermined distance from structures of the relief pattern into the overcoat. The soluble regions are soluble in a predetermined developer while the relief pattern remains insoluble in the predetermined developer. The substrate is then developed with the predetermined developer to remove the soluble regions of the overcoat in step 1003.

Figure 11:
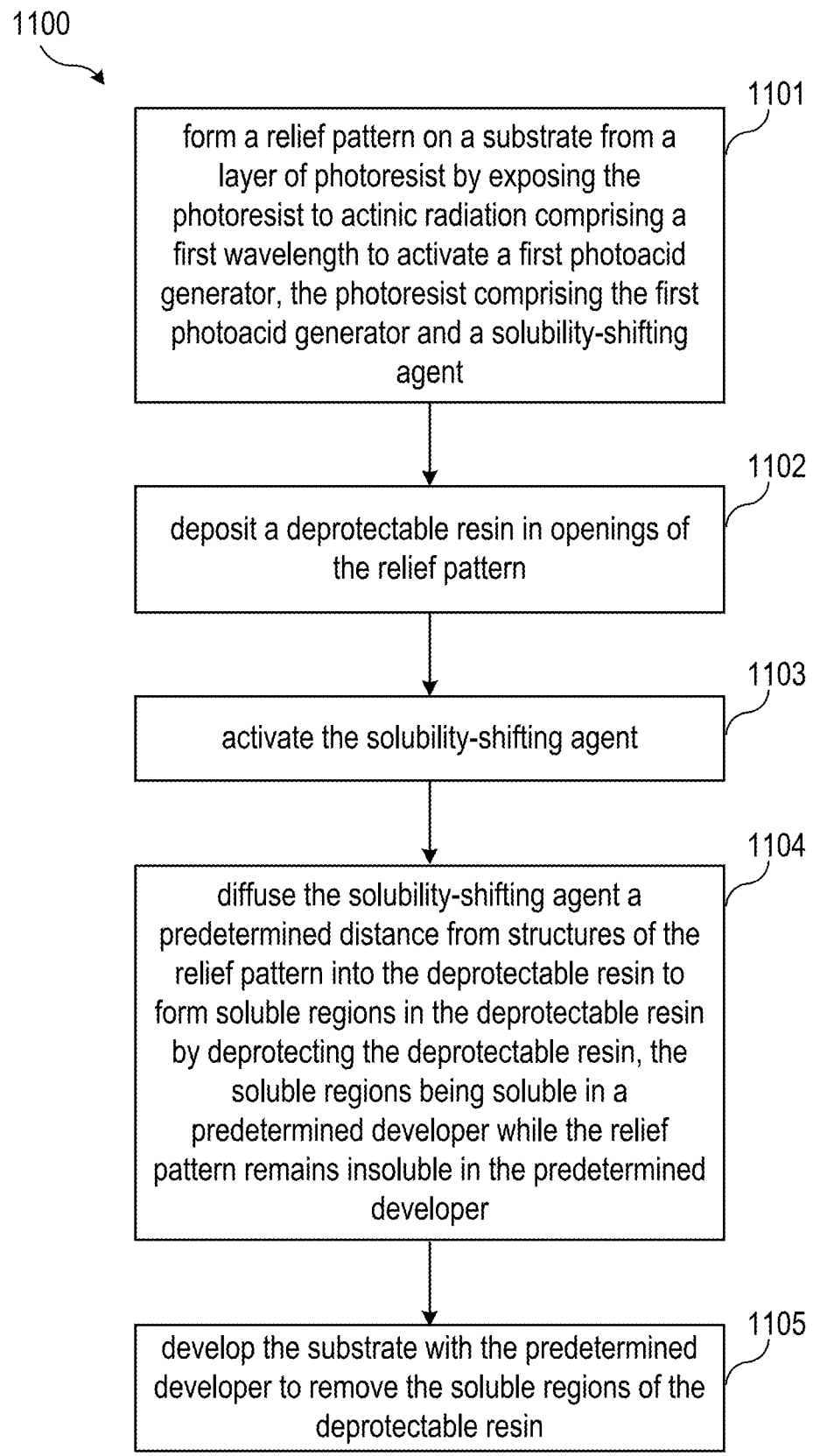
FIG. 11 illustrates an example method of patterning a substrate in accordance with an embodiment of the invention.

FIG. 11 illustrates an example method of patterning a substrate in accordance with an embodiment of the invention. The method of FIG. 11 may be combined with other methods and performed using the systems and apparatuses as described herein. For example, the method of FIG. 11 may be combined with any of the embodiments of FIGS. 2A-8. Additionally, the method of FIG. 11 may be combined with any of the methods of FIGS. 9 and 10, as examples. Although shown in a logical order, the arrangement and numbering of the steps of FIG. 11 are not intended to be limiting. The method steps of FIG. 11 may be performed in any suitable order or concurrently with one another as may be apparent to a person of skill in the art.

Referring to FIG. 11, step 1101 of a method 1100 of patterning a substrate includes forming a relief pattern on a substrate from a layer of photoresist by exposing the photoresist to actinic radiation including a first wavelength to activate a first photoacid generator. The photoresist includes the first photoacid generator and a solubility-shifting agent. A deprotectable resin is deposited in openings of the relief pattern in step 1102.

In step 1103, the solubility-shifting agent is activated. Step 1104 includes diffusing the solubility-shifting agent a predetermined distance from structures of the relief pattern into the deprotectable resin to form soluble regions in the deprotectable resin by deprotecting the deprotectable resin. The soluble regions are soluble in a predetermined developer while the relief pattern remains insoluble in the predetermined developer. Steps 1103 and 1104 may be performed simultaneously, separately, or partially overlapping. The substrate is then developed with the predetermined developer to remove the soluble regions of the overcoat in step 1105.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Example embodiments of the invention are summarized here. Other embodiments can also be understood from the entirety of the specification as well as the claims filed herein.

Example 1. A method of patterning a substrate, the method including: depositing an overcoat in openings of a relief pattern supported by a substrate, the relief pattern including a solubility-shifting agent and a first deprotectable monomer sensitive to the solubility-shifting agent, the overcoat including a second deprotectable monomer sensitive to the solubility-shifting agent, where the relief pattern includes a first solubility threshold relative to a predetermined developer and the overcoat includes a second solubility threshold relative to the predetermined developer lower than the first solubility threshold; activating the solubility-shifting agent to at least reach the second solubility threshold of the overcoat without reaching the first solubility threshold of the relief pattern; diffusing the solubility-shifting agent a predetermined distance from structures of the relief pattern into the overcoat to form soluble regions in the overcoat, the soluble regions being soluble in the predetermined developer while the relief pattern remains insoluble in the predetermined developer; and developing the substrate with the predetermined developer to remove the soluble regions of the overcoat.

Example 2. The method of example 1, where the solubility-shifting agent is a thermal acid generator, and where activating the solubility-shifting agent includes applying heat to the substrate to activate the solubility-shifting agent.

Example 3. The method of example 2, further including: forming the relief pattern on the substrate, the relief pattern further including a photoacid generator different from the solubility-shifting agent, where forming the relief pattern includes forming the relief pattern from a layer of photoresist by exposing the layer of photoresist to actinic radiation to activate the photoacid generator.

Example 4. The method of example 2, further including: forming the relief pattern on the substrate, the solubility-shifting agent also being a photoacid generator, where forming the relief pattern includes forming the relief pattern from a layer of photoresist by exposing the layer of photoresist to actinic radiation to activate the solubility-shifting agent.

Example 5. The method of example 1, where the solubility-shifting agent is a first photoacid generator activated at a first wavelength, the relief pattern further includes a second photoacid generator activated at a second wavelength different from the first wavelength, and activating the solubility-shifting agent includes exposing the first photoacid generator to actinic radiation including the first wavelength to activate the first photoacid generator.

Example 6. The method of one of examples 1 and 2, where the solubility-shifting agent includes a photodestroyable quencher.

Example 7. The method of example 6, where the photodestroyable quencher is camphorsulfonic acid.

Example 8. The method of one of examples 1 to 7, where the overcoat includes a developable bottom anti-reflective coating.

Example 9. The method of one of examples 1 to 8, where the first deprotectable monomer includes methyl-adamantyl methacrylate, isoadamantyl methacrylate, or tert-Butyl acrylate.

Example 10. The method of one of examples 1 to 9, where the second deprotectable monomer includes acetal or ester functionality.

Example 11. The method of one of examples 1 to 10, where the predetermined developer includes tetramethylammonium hydroxide.

Example 12. A method of patterning a substrate, the method including: depositing an overcoat in openings of a relief pattern supported by a substrate, the relief pattern including a solubility-shifting agent and a first deprotectable monomer having a first activation energy, and the overcoat including a second deprotectable monomer having a second activation energy, the first activation energy being higher than the second activation energy; deprotecting the second deprotectable monomer without deprotecting the first deprotectable monomer to form soluble regions in the overcoat by activating the solubility-shifting agent and diffusing the solubility-shifting agent a predetermined distance from structures of the relief pattern into the overcoat, the soluble regions being soluble in a predetermined developer while the relief pattern remains insoluble in the predetermined developer; and developing the substrate with the predetermined developer to remove the soluble regions of the overcoat.

Example 13. The method of example 12, where the solubility-shifting agent is a thermal acid generator, and where activating the solubility-shifting agent includes applying heat to the substrate to activate the solubility-shifting agent.

Example 14. The method of example 12, where the solubility-shifting agent is a photoacid generator, and where activating the solubility-shifting agent includes exposing the photoacid generator to actinic radiation to activate the photoacid generator.

Example 15. The method of one of examples 12 and 13, where the solubility-shifting agent includes a photodestroyable quencher.

Example 16. A method of patterning a substrate, the method including: forming a relief pattern on a substrate from a layer of photoresist by exposing the photoresist to actinic radiation including a first wavelength to activate a first photoacid generator, the photoresist including the first photoacid generator and a solubility-shifting agent; depositing a deprotectable resin in openings of the relief pattern; activating the solubility-shifting agent; diffusing the solubility-shifting agent a predetermined distance from structures of the relief pattern into the deprotectable resin to form soluble regions in the deprotectable resin by deprotecting the deprotectable resin, the soluble regions being soluble in a predetermined developer while the relief pattern remains insoluble in the predetermined developer; and developing the substrate with the predetermined developer to remove the soluble regions of the deprotectable resin.

Example 17. The method of example 16, where the solubility-shifting agent is a thermal acid generator, and where activating the solubility-shifting agent includes applying heat to the substrate to activate the solubility-shifting agent.

Example 18. The method of example 16, where the first photoacid generator is activated at the first wavelength, the solubility-shifting agent is a second photoacid generator activated at a second wavelength, and activating the solubility-shifting agent includes exposing the second photoacid generator to actinic radiation including the second wavelength to activate the second photoacid generator.

Example 19. The method of one of examples 16 and 17, where the solubility-shifting agent includes a photodestroyable quencher.

Example 20. The method of one of examples 16 to 19, where the photoresist includes a higher contrast than the deprotectable resin relative to the predetermined developer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of patterning a substrate, the method comprising:
   forming a relief pattern on a substrate, the relief pattern comprising a first photoacid generator, wherein forming the relief pattern comprises forming the relief pattern from a layer of photoresist by exposing the layer of photoresist to actinic radiation to activate the first photoacid generator;
   depositing an overcoat in openings of the relief pattern supported by the substrate, the relief pattern further comprising a solubility-shifting agent different from the first photoacid generator, and a first deprotectable monomer sensitive to the solubility-shifting agent, the overcoat comprising a second deprotectable monomer sensitive to the solubility-shifting agent, wherein the relief pattern comprises a first solubility threshold relative to a predetermined developer and the overcoat comprises a second solubility threshold relative to the predetermined developer lower than the first solubility threshold;
   activating the solubility-shifting agent to at least reach the second solubility threshold of the overcoat without reaching the first solubility threshold of the relief pattern;
   diffusing the solubility-shifting agent a predetermined distance from structures of the relief pattern into the overcoat to form soluble regions in the overcoat, the soluble regions being soluble in the predetermined developer while the relief pattern remains insoluble in the predetermined developer; and
   developing the substrate with the predetermined developer to remove the soluble regions of the overcoat.

2. The method of claim 1, wherein the solubility-shifting agent is a thermal acid generator, and wherein activating the solubility-shifting agent comprises applying heat to the substrate to activate the solubility-shifting agent.

3. The method of claim 1, wherein
   the first photoacid generator is activated at a first wavelength, the solubility-shifting agent is a second photoacid generator activated at a second wavelength different from the first wavelength, and activating the solubility-shifting agent comprises exposing the second photoacid generator to actinic radiation comprising the second wavelength to activate the second photoacid generator.

4. The method of claim 1, wherein the solubility-shifting agent comprises a photodestroyable quencher.

5. The method of claim 4, wherein the photodestroyable quencher is camphorsulfonic acid.

6. The method of claim 1, wherein the overcoat comprises a developable bottom anti-reflective coating.

7. The method of claim 1, wherein the first deprotectable monomer comprises methyl-adamantyl methacrylate, iso-adamantyl methacrylate, or tert-Butyl acrylate.

8. The method of claim 1, wherein the second deprotectable monomer comprises acetal or ester functionality.

9. The method of claim 1, wherein the predetermined developer comprises tetramethylammonium hydroxide.

10. A method of patterning a substrate, the method comprising:
forming a relief pattern on a substrate, the relief pattern comprising a first photoacid generator, wherein forming the relief pattern comprises forming the relief pattern from a layer of photoresist by exposing the layer of photoresist to actinic radiation to activate the first photoacid generator;
depositing an overcoat in openings of the relief pattern supported by the substrate, the relief pattern further comprising a solubility-shifting agent different from the first photoacid generator, and a first deprotectable monomer having a first activation energy, and the overcoat comprising a second deprotectable monomer having a second activation energy, the first activation energy being higher than the second activation energy;
deprotecting the second deprotectable monomer without deprotecting the first deprotectable monomer to form soluble regions in the overcoat by activating the solubility-shifting agent and diffusing the solubility-shifting agent a predetermined distance from structures of the relief pattern into the overcoat, the soluble regions being soluble in a predetermined developer while the relief pattern remains insoluble in the predetermined developer; and
developing the substrate with the predetermined developer to remove the soluble regions of the overcoat.

11. The method of claim 10, wherein the solubility-shifting agent is a thermal acid generator, and wherein activating the solubility-shifting agent comprises applying heat to the substrate to activate the solubility-shifting agent.

12. The method of claim 10, wherein the solubility-shifting agent is a second photoacid generator, and wherein activating the solubility-shifting agent comprises exposing the second photoacid generator to actinic radiation to activate the second photoacid generator.

13. The method of claim 10, wherein the solubility-shifting agent comprises a photodestroyable quencher.

14. A method of patterning a substrate, the method comprising:
forming a relief pattern on a substrate from a layer of photoresist by exposing the photoresist to actinic radiation comprising a first wavelength to activate a first photoacid generator, the photoresist comprising the first photoacid generator and a solubility-shifting agent;
depositing a deprotectable resin in openings of the relief pattern;
activating the solubility-shifting agent;
diffusing the solubility-shifting agent a predetermined distance from structures of the relief pattern into the deprotectable resin to form soluble regions in the deprotectable resin by deprotecting the deprotectable resin, the soluble regions being soluble in a predetermined developer while the relief pattern remains insoluble in the predetermined developer; and
developing the substrate with the predetermined developer to remove the soluble regions of the deprotectable resin.

15. The method of claim 14, wherein the solubility-shifting agent is a thermal acid generator, and wherein activating the solubility-shifting agent comprises applying heat to the substrate to activate the solubility-shifting agent.

16. The method of claim 14, wherein
the first photoacid generator is activated at the first wavelength,
the solubility-shifting agent is a second photoacid generator activated at a second wavelength, and
activating the solubility-shifting agent comprises exposing the second photoacid generator to actinic radiation comprising the second wavelength to activate the second photoacid generator.

17. The method of claim 14, wherein the solubility-shifting agent comprises a photodestroyable quencher.

18. The method of claim 14, wherein the photoresist comprises a higher contrast than the deprotectable resin relative to the predetermined developer.

19. A method of patterning a substrate, the method comprising:
depositing an overcoat in openings of a relief pattern supported by a substrate, the relief pattern comprising a solubility-shifting agent and a first deprotectable monomer sensitive to the solubility-shifting agent, the overcoat comprising a second deprotectable monomer sensitive to the solubility-shifting agent, wherein the relief pattern comprises a first solubility threshold relative to a predetermined developer and the overcoat comprises a second solubility threshold relative to the predetermined developer lower than the first solubility threshold;
activating the solubility-shifting agent to at least reach the second solubility threshold of the overcoat without reaching the first solubility threshold of the relief pattern;
diffusing the solubility-shifting agent a predetermined distance from structures of the relief pattern into the overcoat to form soluble regions in the overcoat, the soluble regions being soluble in the predetermined developer while the relief pattern remains insoluble in the predetermined developer; and
developing the substrate with the predetermined developer to remove the soluble regions of the overcoat, wherein
the solubility-shifting agent is a first photoacid generator activated at a first wavelength,
the relief pattern further comprises a second photoacid generator activated at a second wavelength different from the first wavelength, and
activating the solubility-shifting agent comprises exposing the first photoacid generator to actinic radiation comprising the first wavelength to activate the first photoacid generator.

20. The method of claim 19, the overcoat comprises a developable bottom anti-reflective coating.

* * * * *